United States Patent
Noshiro

(10) Patent No.: US 11,328,769 B2
(45) Date of Patent: May 10, 2022

(54) RESISTANCE CHANGE DEVICE, MANUFACTURING METHOD FOR THE SAME, AND STORAGE APPARATUS

(71) Applicant: FUJITSU LIMITED, Kawasaki (JP)

(72) Inventor: Hideyuki Noshiro, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 160 days.

(21) Appl. No.: 16/533,735

(22) Filed: Aug. 6, 2019

(65) Prior Publication Data

US 2020/0066338 A1 Feb. 27, 2020

(30) Foreign Application Priority Data

Aug. 24, 2018 (JP) .............................. JP2018-157213

(51) Int. Cl.
*G11C 13/00* (2006.01)
*H01L 45/00* (2006.01)

(52) U.S. Cl.
CPC ........ *G11C 13/0011* (2013.01); *G11C 13/004* (2013.01); *G11C 13/0069* (2013.01);
(Continued)

(58) Field of Classification Search
CPC ............ G11C 13/0011; G11C 13/0069; G11C 13/004; G11C 2213/31; G11C 2013/005; G11C 2013/0045; G11C 2013/009; G11C 2213/52; G11C 13/003; G11C 13/0061; H01L 45/085; H01L 45/1266;
(Continued)

(56) References Cited

U.S. PATENT DOCUMENTS

| 6,485,622 B1 * | 11/2002 | Fu ............................ C03C 4/18 |
| | | 204/421 |
| 10,516,164 B2 * | 12/2019 | Nakayama ............. C01G 53/42 |

(Continued)

FOREIGN PATENT DOCUMENTS

| JP | 2003-157672 A | 5/2003 |
| JP | 2012-89567 A | 5/2012 |
| WO | 2009/122567 | 10/2009 |

OTHER PUBLICATIONS

Elliot J. Fuller et al., "Li-Ion Synaptic Transistor for Low Power Analog Computing", Advanced Materials, vol. 29, Issue 1, pp. 1604310-1-1604310-8, 2017.
(Continued)

*Primary Examiner* — Mohammed A Bashar
(74) *Attorney, Agent, or Firm* — Fujitsu Patent Center

(57) ABSTRACT

A resistance change device includes a first resistance change layer that occludes and discharges ions of at least one type, and resistance of the first resistance change layer, changes in accordance with an amount of the ions in such a manner that the resistance decreases when the ions are discharged and the resistance increases when the ions are occluded; a second resistance change layer that occludes and discharges the ions, and resistance of the second resistance change layer changes in accordance with the amount of the ions in such a manner that the resistance increases when the ions are discharged and the resistance decreases when the ions are occluded; and an ion conductive layer that carries the ions and is provided between the first resistance change layer and the second resistance change layer.

16 Claims, 15 Drawing Sheets

(52) U.S. Cl.
CPC ........ *H01L 45/085* (2013.01); *H01L 45/1233* (2013.01); *H01L 45/1266* (2013.01); *H01L 45/147* (2013.01); *H01L 45/1608* (2013.01); *G11C 2013/005* (2013.01); *G11C 2013/009* (2013.01); *G11C 2013/0045* (2013.01); *G11C 2213/31* (2013.01); *G11C 2213/52* (2013.01)

(58) Field of Classification Search
CPC .............. H01L 45/1608; H01L 45/147; H01L 45/1233; H01L 27/2436
See application file for complete search history.

(56) References Cited

U.S. PATENT DOCUMENTS

| | | | |
|---|---|---|---|
| 2010/0001267 A1* | 1/2010 | Manning | G11C 13/025 257/40 |
| 2011/0006277 A1 | 1/2011 | Kubo et al. | |
| 2011/0176351 A1* | 7/2011 | Fujitsuka | H01L 45/1233 365/148 |
| 2012/0091420 A1 | 4/2012 | Kusai et al. | |
| 2012/0211719 A1* | 8/2012 | Haimoto | H01L 45/1233 257/4 |
| 2015/0083987 A1* | 3/2015 | Kakushima | H01L 45/1233 257/4 |
| 2019/0259945 A1* | 8/2019 | Jung | G11C 13/0011 |

OTHER PUBLICATIONS

JPOA—Office Action of Japanese Patent Application No. 2018-157213 dated Feb. 22, 2022 with Machine Translation.

\* cited by examiner

RESISTANCE CHANGE DEVICE, MANUFACTURING METHOD FOR THE SAME, AND STORAGE APPARATUS

CROSS-REFERENCE TO RELATED APPLICATION

This application is based upon and claims the benefit of priority of the prior Japanese Patent Application No. 2018-157213, filed on Aug. 24, 2018, the entire contents of which are incorporated herein by reference.

FIELD

The embodiments discussed herein are related to a resistance change device, a manufacturing method for the same, and a storage apparatus.

BACKGROUND

Such an information storage device has been proposed that utilizes a principle of a secondary battery configured to charge and discharge by the movement of ions between a positive-electrode active material layer and a negative-electrode active material layer through an electrolytic layer, and makes use of the configuration thereof.

Japanese Laid-open Patent Publication No. 2012-89567 and Japanese Laid-open Patent Publication No. 2003-157672 are examples of related art.

SUMMARY

According to an aspect of the embodiments, a resistance change device includes a first resistance change layer that occludes and discharges ions of at least one type, and resistance of the first resistance change layer changes in accordance with an amount of the ions in such a manner that the resistance decreases when the ions are discharged and the resistance increases when the ions are occluded; a second resistance change layer that occludes and discharges the ions, and resistance of the second resistance, change layer changes in accordance with the amount of the ions in such a manner that the resistance increases when the ions are discharged and the resistance decreases when the ions are occluded; and an ion conductive layer that carries the ions and is provided between the first resistance change layer and the second resistance change layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In a case where the configuration of the secondary battery mentioned above is applied to a resistance change device included in a storage apparatus, it is considered that, for example, a positive-electrode active material layer is used for a resistance change layer which is able to occlude and discharge ions and in which resistance is changed in accordance with the amount of ions, an electrolytic layer is used for an ion conductive layer configured to carry ions but not carry electrons, and a negative-electrode active material layer is used for an ion occlusion and discharge layer that is able to occlude and discharge ions.

In this case, due to the movement of ions between the resistance change layer and the ion occlusion and discharge layer through the ion conductive layer, the amount of ions in the resistance change layer varies and the resistance changes in response to the variation in the amount of ions, which makes it possible to cause the above configuration to function as a resistance change device.

However, since a material having high resistivity is used for the positive-electrode active material layer, it has been found that, in the case where the positive-electrode active material layer is used for the resistance change layer, the resistance becomes large and the readout current becomes small, thereby causing a malfunction.

Hereinafter, using the drawings, a resistance change device, a manufacturing method for the stated resistance change device, and a storage apparatus according to an embodiment of the present disclosure will be described with reference to FIGS. 1 to 17.

Figure 1:
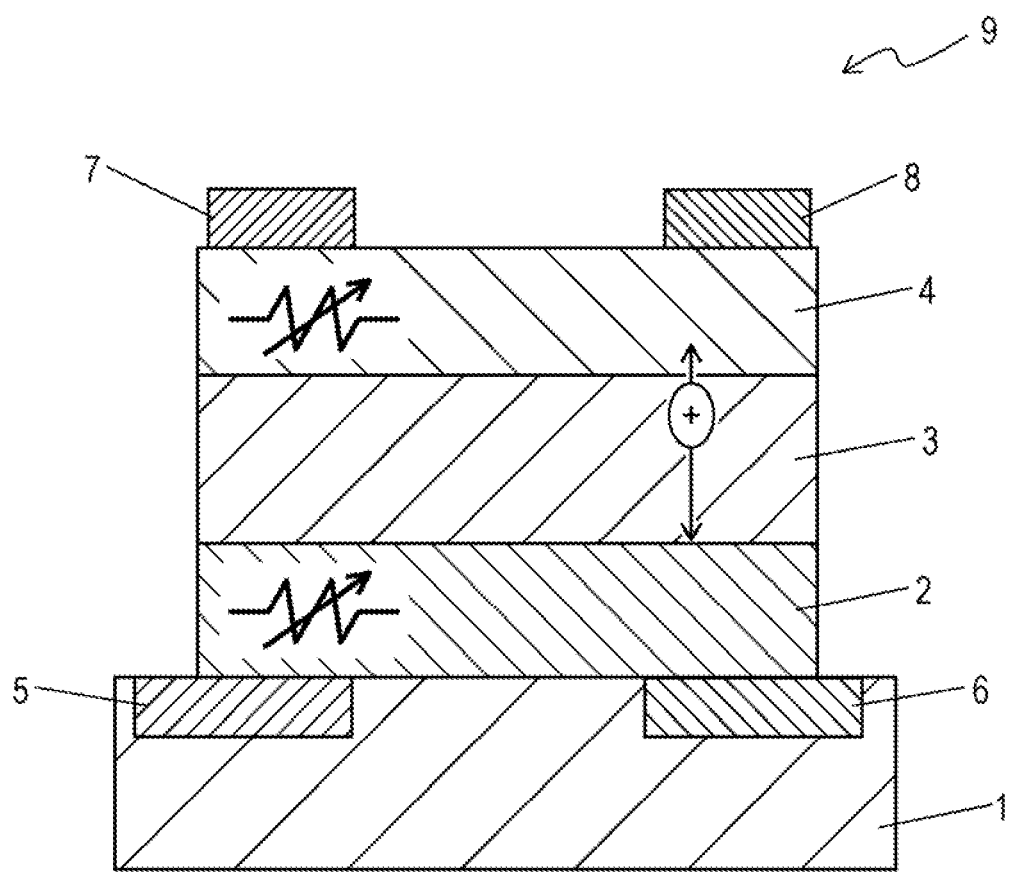
FIG. 1 is a cross-sectional view illustrating a configuration of a resistance change device according to the present embodiment.

As illustrated in FIG. 1, a resistance change device according to the present embodiment includes, on a substrate 1, two resistance change layers (a first resistance change layer 2 and a second resistance change layer 4) which are able to occlude and discharge ions of at least one type and in which resistance is changed in accordance with the amount of ions of at least one type, and an ion conductive layer 3 that is provided between the first resistance change layer 2 and second resistance change layer 4, and carries ions of at least one type.

Here, the two resistance change layers 2 and 4 are each formed of a material which is able to occlude and discharge ions of at least one type, and the resistance of which changes in accordance with the amount (concentration) of ions of at least one type. The ion conductive layer 3 is formed of a material configured to carry ions of at least one type.

In this case, due to the movement of ions between the first resistance change layer 2 and second resistance change layer 4 through the ion conductive layer 3, the amount of ions in the first resistance change layer 2 and second resistance change layer 4 vary, and the resistance thereof changes in response to the variations in the amount of ions, which makes it possible to cause the above configuration to function as a resistance change device 9.

As described above, the resistance change device 9 of the present embodiment has a structure including two resistance change layers 2 and 4 on the lower and upper sides with the ion conductive layer 3 interposed therebetween, in which their resistance values change in accordance with the composition ratios.

Note that the ion conductive layer 3 is an ion conductive layer configured to carry ions of at least one type but not carry electrons. Further, an ion that moves passing through the ion conductive layer 3 is also referred to as a conductive ion.

It is also possible to continuously change the resistance values of the first resistance change layer 2 and second resistance change layer 4 by continuously varying the amount of ions in these layers, and therefore it is possible to achieve a multi-valued resistance change device able to store a large number of resistance values.

In the present embodiment, the first resistance change layer 2 is a layer able to occlude and discharge ions of at least one type and the resistance thereof changes in accordance with the amount of ions of at least one type, that is, the first resistance change layer 2 is a resistance change layer in which the resistance decreases when the ions of at least one type are discharged, and the resistance increases when the ions of at least one type are occluded.

Here, since the first resistance change layer 2 is disposed in a lower layer, it is also referred to as a lower-side resistance change layer or a resistance change layer in the lower layer.

The second resistance change layer 4 is layer able to occlude and discharge ions of at least one toe and the resistance thereof changes in accordance with the amount of ions of at least one type, that is, the second resistance change layer 4 is a resistance change layer in which the resistance increases when the ions of at least one type are discharged and the resistance decreases when the ions of at least one type are occluded.

Here, since the second resistance change layer 4 is disposed in an upper layer, it is also referred to as an upper-side resistance change layer or a resistance change layer in the upper layer.

In the present embodiment, although the first resistance change layer 2 is disposed under the ion conductive layer 3, in other words, on the side closer to the substrate 1, and the second resistance change layer 4 is disposed above the ion conductive layer 3, in other words, on the side farther from the substrate 1, the positions of the resistance change layers are not limited thereto.

For example, the first resistance change layer 2 may be disposed above the ion conductive layer 3, in other words, on the side farther from the substrate 1, and the second resistance change layer 4 may be disposed under the ion conductive layer 3, in other words, on the side closer to the substrate 1. That is, the first resistance change layer 2 may serve as the upper-side resistance change layer disposed in the upper layer, and the second resistance change layer 4 may serve as the lower-side resistance change layer disposed in the lower layer.

The ions discharged from the first resistance change layer 2 pass through the ion conductive layer 3 to be occluded in the second resistance change layer 4, the ions discharged from the second resistance change layer 4 pass through the ion conductive layer 3 to be occluded in the first resistance change layer 2.

By the situation in which the ions discharged from the first resistance change layer 2 pass through the ion conductive layer 3 and are occluded in the second resistance change layer 4, the resistance of the first resistance change layer 2 and the resistance of the second resistance change layer 4 are both decreased. By the situation in which the ions discharged from the second resistance change layer 4 pass through the ion conductive layer 3 and are occluded in the first resistance change layer 2, the resistance of the first resistance change layer 2 and the resistance of the second resistance change layer 4 are both increased.

In the first resistance change layer 2 and second resistance change layer 4, the resistance changes occur simultaneously at a write time. In other words, the occlusion and the discharge of ions in the two resistance change layers 2 and 4 occur simultaneously at the write time when the resistance of each of the two resistance change layers 2 and 4 is changed.

Note that the resistance change device 9 according to the present embodiment is a resistance change device to which applied is a configuration of a secondary battery to perform charge and discharge by the movement of ions between a positive-electrode active material layer and a negative-electrode active material layer through an electrolytic layer. The secondary battery is also referred to as a solid secondary battery or an ion battery.

That is, the positive-electrode active material layer and the negative-electrode active material layer of the secondary battery are used for the resistance change layers 2 and 4 which are able to occlude and discharge ions of at least one type, and each resistance of which changes in accordance with the amount of the ions, and the electrolytic layer is used for the ion conductive layer 3 configured to carry the ions.

In the present embodiment, the first resistance change layer 2 is a positive-electrode active material layer formed of a positive-electrode active material used in the ion battery, the ion conductive layer 3 is a solid electrolytic layer formed of a solid electrolyte used in the ion battery, and the second resistance change layer 4 is a negative-electrode active material layer formed of a negative-electrode active material used in the ion battery.

In other words, the resistance change device 9 of the present embodiment is a resistance change device containing a solid electrolytic material, and has a structure in which the solid electrolytic layer (the ion conductive layer 3) is sandwiched between the two resistance change layers (the first resistance change layer 2 and second resistance change layer 4) as a positive-electrode active material layer and a negative-electrode active material layer.

Here, the first resistance change layer 2 is a positive-electrode active material layer in which the resistance decreases when the ions are discharged, and the resistance increases when the ions are occluded.

The second resistance change layer 4 is a negative-electrode active material layer in which the resistance increases when the ions are discharged, and the resistance decreases when the ions are occluded.

In this manner, in the case where the first resistance change layer 2 is formed of a positive-electrode active material whose resistance decreases when the ions are discharged the second resistance change layer 4 is formed of a negative-electrode active material whose resistance decreases when the ions are occluded.

In the case where the first resistance change layer 2 is formed of a positive-electrode active material whose resistance increases when the ions are occluded, the second resistance change layer 4 is formed of a negative-electrode active material whose resistance increases when the ions are discharged.

Not being limited to the above, the first resistance change layer 2 may be a negative-electrode active material layer whose resistance decreases when the ions are discharged and increases when the ions are occluded, and the second resistance change layer 4 may be a positive-electrode active material layer whose resistance increases when the ions are discharged and decreases when the ions are occluded.

That is, in the case where the first, resistance change layer 2 is formed of a negative-electrode active material whose resistance decreases when the ions are discharged, the second resistance change layer 4 may be formed of a positive-electrode active material whose resistance decreases when the ions are occluded.

In the case where the first resistance change layer 2 is formed of a negative-electrode active material whose resistance increases when the ions are occluded, the second resistance change layer may be formed of a positive-electrode active material whose resistance increases when the ions are discharged.

As described above, one of the first resistance change layer 2 and second resistance change layer 4 formed of the positive-electrode active material or negative-electrode active material discharges ions, and the other one of them occludes ions.

For example, in a case of using Li ions, the negative-electrode active, material forming the second resistance change layer 4 may use $Li_4Ti_5O_{12}$ or the like configured to decrease the resistance when the Li ions are occluded, the solid electrolyte forming the ion conductive layer 3 may use $Li_3PO_4$, $Li_9Al_3(P_2O_7)_3(PO_4)_2$, $Li_{2.9}PO_{3.3}N_{0.46}$, $(La, Li)TiO_3$ or the like, and the positive electrode active material forming the first resistance change layer 2 may use $LiCoO_2$, $LiNiO_2$, $LiTi_5O_{12}$, $LiMnO_2$, $LiFePO_4$ or the like configured to decrease the resistance when the Li ions are discharged.

Ions other than Li ions may be used.

In the present embodiment, the resistance change device 9 includes, as illustrated in FIG. 1, a first electrode 5 and a second electrode 6 that are provided separate from each other to be connected to the first resistance change layer 2, and a third electrode 7 and a fourth electrode 8 that are provided separate from each other to be connected to the second resistance change layer 4.

Here, the first electrode 5 and second electrode 6 are disposed under the first resistance change layer 2 as the lower-side resistance change layer. The third electrode 7 and fourth electrode 8 are disposed above the second resistance change layer 4 as the upper-side resistance change layer.

When information (resistance value) is to be written, a write voltage may be applied to the first resistance change layer 2 and second resistance change layer 4 via at least one of the first electrode 5 and second electrode 6 and via at least one of the third electrode 7 and fourth electrode 8, and the information may be written by causing the resistance of the first resistance change layer 2 and second resistance change layer 4 to change.

Here, by applying a positive voltage to at least one of the first electrode 5 and second electrode 6 and by grounding at least one of the third electrode 7 and fourth electrode 8, or by grounding at least one of the first electrode 5 and second electrode 6 and by applying a positive voltage to at least one of the third electrode 7 and fourth electrode 8, the write voltage may be applied to the first resistance change layer 2 and second resistance change layer 4.

When information (resistance value) is to be read out, a read voltage may be applied to the first resistance change layer 2 via the first electrode 5 and second electrode 6, and the read voltage may also be applied to the second resistance change layer 4 via the third electrode 7 and fourth electrode 8; then the information may be read out by detecting a current flowing through the first resistance change layer 2 and second resistance change layer 4.

Figure 2:
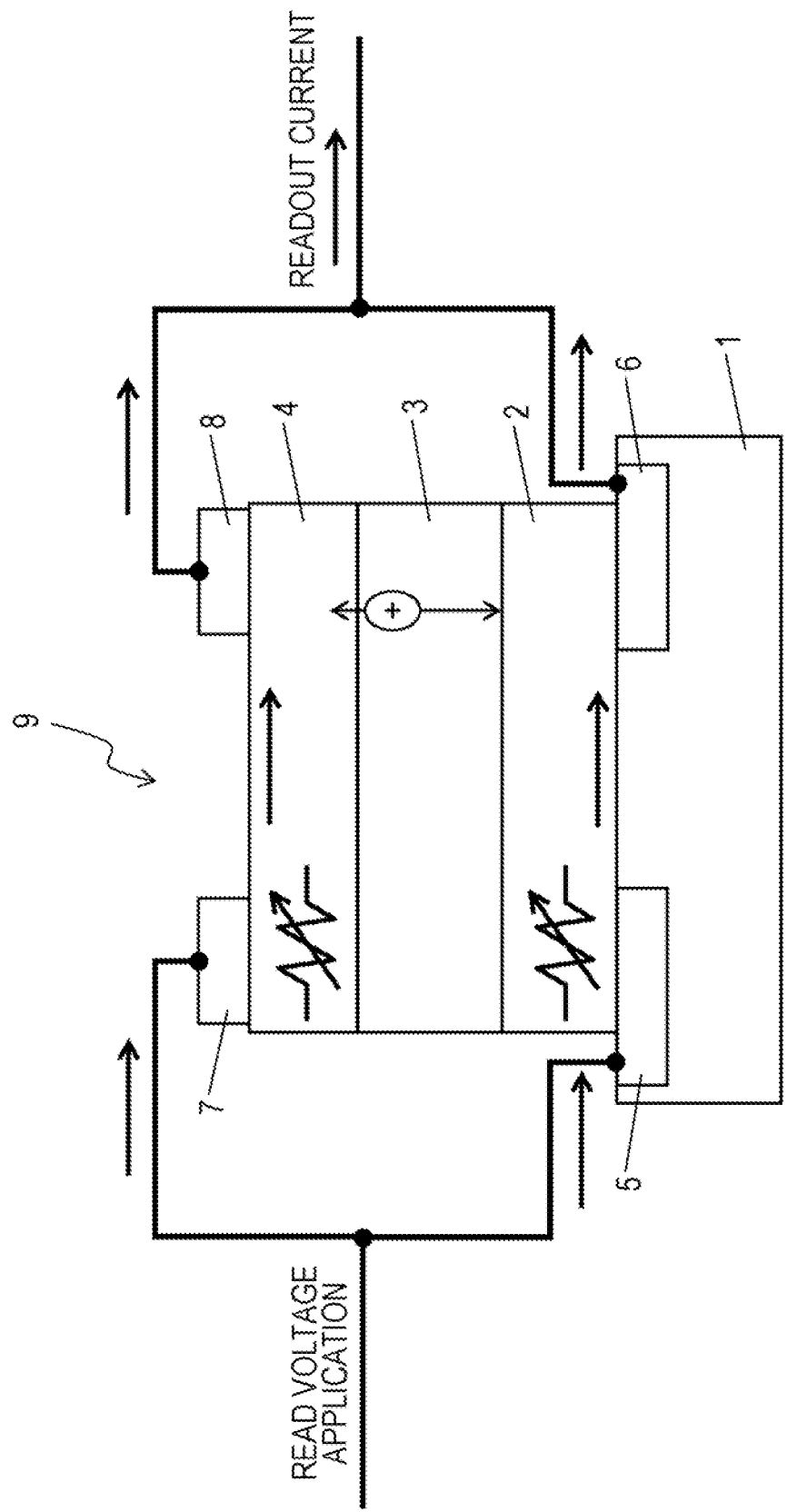
FIG. 2 is a diagram illustrating a case where a first resistance change layer and a second resistance change layer of the resistance change device according to the present embodiment are connected in parallel.

Here, as illustrated in FIG. 2, the first resistance change layer 2 and second resistance change layer 4 are connected in parallel, and the read voltage is applied to the first resistance change layer 2 and second resistance change layer 4 to detect a current (readout current) flowing through the first resistance change layer 2 and second resistance change layer 4, thereby reading out the information (resistance value).

As described above, the first electrode 5 and second electrode 6 used for reading out a resistance value of the first resistance change layer 2 are disposed separate from each other, and the third electrode 7 and fourth electrode 8 used for reading out a resistance value of the second resistance change layer 4 are disposed separate from each other.

This makes it possible to obtain a change in resistance sufficient to function as the resistance change device 9, and improve characteristics thereof.

In contrast, in a case where an electrode used for reading out the resistance value of the resistance change layer is provided over the entire surface of the resistance change layer, the resistance change become small, which makes it difficult to obtain a change in resistance sufficient to function as a resistance change device.

That is, in a case where a positive-electrode active material, which is a material having high resistivity, is used in a secondary battery, an electrode layer is laminated on the positive-electrode active material layer to be provided over the entire surface of the positive-electrode active material layer. Since the resistance value is lowered in this manner, no problem occurs.

However, in a case where a positive-electrode active material is used as a resistance change layer, when an electrode layer is laminated on the resistance change layer to be provided over the entire surface of the resistance change layer, the resistance change is given by combined resistance of the resistance change layer and the electrode layer having low resistivity. This may cause the resistance change to be small.

Accordingly, it is difficult to obtain a change in resistance sufficient to function as a resistance change device.

Further, in the case where information (resistance value) is read out in the manner discussed above, a combined resistance value (combined resistance) of the resistance values of the first resistance change layer 2 and second resistance change layer 4 is read out as information (resistance value) stored in the resistance change device 9.

In other words, when information is to be read out, the reading of the information is performed by detecting a current (readout current) flowing through the two resistance change layers 2 and 4, and determining a resistance value (combined resistance value) based on the detected current. Accordingly, it is possible to cause the current (readout current) flowing through the resistance change device 9 to be large when the information is read out.

This makes it possible to obtain a sufficient readout current, and suppress malfunctioning such as making a wrong determination of whether a resistance value stored as information is "0" or "1", for example, thereby making it possible to improve the characteristics.

Hereinafter, description will be given while citing specific examples.

When information (resistance value) is to be written, that is, when a resistance value of the resistance change device 9 (device resistance) is to be changed, a voltage for causing ions to move (write voltage) may be applied between one or both of the first and second electrodes 5, 6 and one or both of the third and fourth electrodes 7, 8, and the information may be written by causing the resistance (resistance value) of each of the first resistance change layer 2 and second resistance change layer 4 to change.

For example, in a case where $LiCoO_2$ as a positive-electrode active material is used for the first resistance change layer 2 in the lower layer and $Li_4Ti_5O_{12}$ as a negative-electrode active material is used for the second resistance change layer 4 in the upper layer, the write voltage may be applied to the first resistance change layer 2 and second resistance change layer 4 by applying a positive voltage to the first electrode 5 and second electrode 6, and grounding the third electrode 7 and fourth electrode 8.

With this, Li ions move from $LiCoO_2$ forming the first resistance change layer 2 toward $Li_4Ti_5O_{12}$ forming the second resistance change layer 4 so that the resistance (resistance value) of each of the first resistance change layer 2 and second resistance change layer 4 is changed, whereby the writing of the information is performed.

On the other hand, by applying a positive voltage to the third electrode 7 and fourth electrode 8 and grounding the first electrode 5 and second electrode 6, the write voltage may be applied to the first resistance change layer 2 and second resistance change layer 4.

With this, the Li ions move from $Li_4Ti_5O_{12}$ forming the second resistance change layer 4 toward $LiCoO_2$ forming the first resistance change layer 2 so that the resistance (resistance value) of each of the first resistance change layer 2 and second resistance change layer 4 is changed, whereby the writing of the information is performed.

When the writing of the information is performed as discussed above, the amount of resistance change of the first resistance change layer 2 and second resistance change layer 4 varies in accordance with the amount of movement of the Li ions. In other words, the amount of a change in combined resistance of the first resistance change layer 2 and second resistance change layer 4, that is, the amount of a change in resistance of the resistance change device 9 varies in accordance with the amount of movement of the Li ions.

It is possible to control the amount of movement of the Li ions by a voltage applied between the first and second electrodes 5, 6 and the third and fourth electrodes 7, 8, the number of pulses, a pulse time, and the like.

Figure 3:
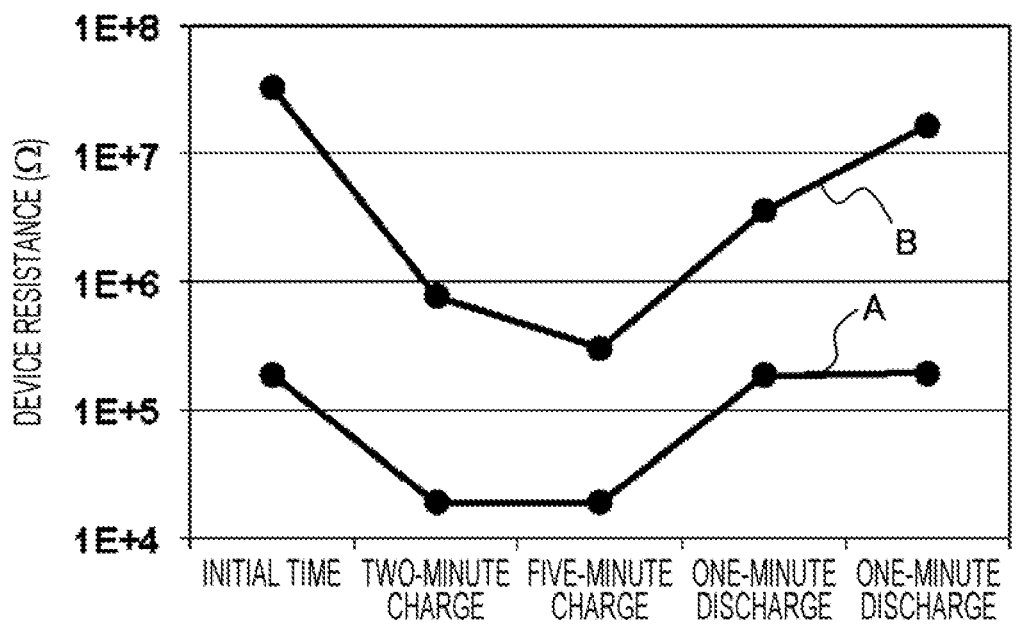
FIG. 3 is a graph depicting changes in resistance of the resistance change device according to the present embodiment and a resistance change device of related art.

FIG. 3 is a graph depicting a resistance change of the resistance change device according to the present embodiment.

In FIG. 3, a solid line A indicates a change in device resistance of the resistance change device 9 of the present embodiment (for example, see FIG. 1).

A solid line B in FIG. 3 indicates a change in device resistance of a resistance change device of related art, that is, a change in device resistance of a resistance change device 11 (for example, see FIG. 4) that is provided with an Li layer (an Li metal, which is an ion occlusion and discharge layer) 10 in place of the second resistance change layer 4 in the upper layer of the resistance change device of the present embodiment, and is provided with only a resistance change layer 2 in the lower layer as a resistance change layer.

Note that in the resistance change device 9 of the present embodiment, a change in device resistance is a change in combined resistance of the resistance change layer 4 in the upper layer and the resistance change layer 2 in the lower layer; on the other hand, in the resistance change device 11 of related art, a change in device resistance is only a change in resistance of the resistance change layer 2 in the lower layer.

In FIG. 3, "two-minute charge" refers to a case in which a positive voltage is applied to the first electrode 5 and second electrode 6, the third electrode 7 and fourth electrode 8 are grounded, and a charging current of 2 µA is flowed for two minutes.

In this case, Li ions move from $LiCoO_2$ forming the first resistance change layer 2 in the lower layer toward $Li_4Ti_5O_{12}$ forming the second resistance change layer 4 in the upper layer so that the resistance (resistance value) of each of the first resistance change layer 2 and second resistance change layer 4, that is, the resistance value (device resistance) of the resistance change device 9 is changed, whereby the writing of the information is performed.

In FIG. 3, "one-minute discharge" refers to a case in which the first electrode 5 and second electrode 6 are grounded, a positive voltage is applied to the third electrode 7 and fourth electrode 8, and a discharging current of 2 μA is flowed for one minute.

In this case, Li ions move from $Li_4Ti_5O_{12}$ forming the second resistance change layer 4 in the upper layer toward $LiCoO_2$ forming the first resistance change layer 2 in the lower layer so that the resistance (resistance value) of each of the first resistance change layer 2 and second resistance change layer 4, that is, the resistance value (device resistance) of the resistance change device 9 is changed, whereby the writing of the information is performed.

First, the resistance value of the resistance change device 9 of the present embodiment and the resistance value of the resistance change device 11 of related art were measured. These values were taken as initial values.

Next, charging was performed for two minutes, and the resistance value of the resistance change device 9 of the present embodiment and the resistance value of the resistance change device 11 of related art were measured.

Subsequently, charging was further performed for five minutes, and the resistance value of the resistance change device 9 of the present embodiment and the resistance value of the resistance change device 11 of related art were measured.

Next, discharging was performed for one minute, and the resistance value of the resistance change device 9 of the present embodiment and the resistance value of the resistance change device 11 of related art were measured.

Finally, discharging was performed for one minute, and the resistance value of the resistance change device 9 of the present embodiment and the resistance value of the resistance change device 11 of related art were measured.

The measurement results of the resistance values obtained in the above manner are given in FIG. 3.

As depicted in FIG. 3, it was observed that, in both the resistance change device 11 of related art and the resistance change device 9 of the present embodiment, the resistance value decreased when charging was performed, and the resistance value increased when discharging was performed.

The device resistance (resistance value) of the resistance change device 11 of related art was on the order of $10^5$ Ω to $10^7$ Ω, while the device resistance of the resistance change device 9 of the present embodiment was on the order of $10^4$ Ω to $10^5$ Ω, and therefore it was confirmed that an effect of a reduction in resistance value was obtained by one to two orders.

The information (resistance value) may be written as discussed above, and the information (resistance value) may be read out in the following manner.

For example, as illustrated in FIG. 2, the first electrode 5 is connected to the third electrode 7 and the second electrode 6 is connected to the fourth electrode 8 in such a manner that the first resistance change layer 2 in the lower layer and the second resistance change layer 4 in the upper layer are connected in parallel.

Then, a read voltage (for example, about 0.1 V) is applied between the first electrode 5 and second electrode 6 and between the third electrode 7 and fourth electrode 8, that is, the read voltage is applied to the first resistance change layer 2 and second resistance change layer 4, and the information may be read out by detecting a current (readout current) flowing through these layers, that is, flowing through the first resistance change layer 2 and second resistance change layer 4.

When information is read out in the manner discussed above, the combined resistance (combined resistance value) of the first resistance change layer 2 and second resistance change layer 4, that is, the resistance (resistance value) of the resistance change device 9 is determined based on a combined current flowing through the first resistance change layer 2 and second resistance change layer 4, and the determined resistance read out a information (resistance value) stored in the resistance change device 9.

Then, in the resistance change device 9 of the present embodiment, when information is to be read out, by detecting a current (readout current) flowing through the two resistance change layers 2 and 4, and determining a resistance value (combined resistance value) based on the detected current, the information is read out. Accordingly, the current (readout current) flowing through the resistance change device may be made large when the information is read out.

This makes it possible to obtain a sufficient readout current, and suppress malfunctioning such as making a wrong determination of whether a resistance value stored as information is "0" or "1", for example, thereby making it possible to improve the characteristics.

Note that in the resistance change, device 9 of the present embodiment, it is possible to obtain the above-discussed effect of the reduction in resistance value and also possible to obtain the effect in which the readout current may be made large, the occurrence of a malfunction may be suppressed, and the characteristics thereof may be improved. In addition, the following effects are also obtained.

Figure 4:
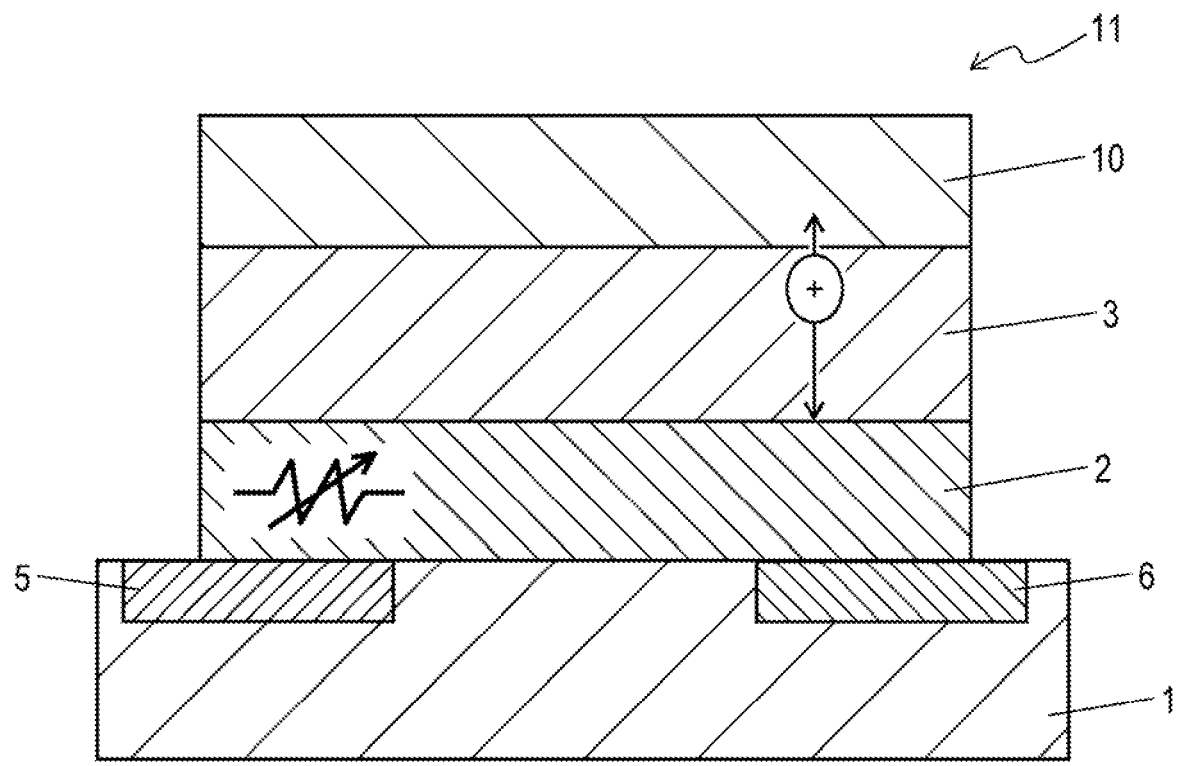
FIG. 4 is a cross-sectional view illustrating a configuration of the resistance change device of related art.
Figure 5:
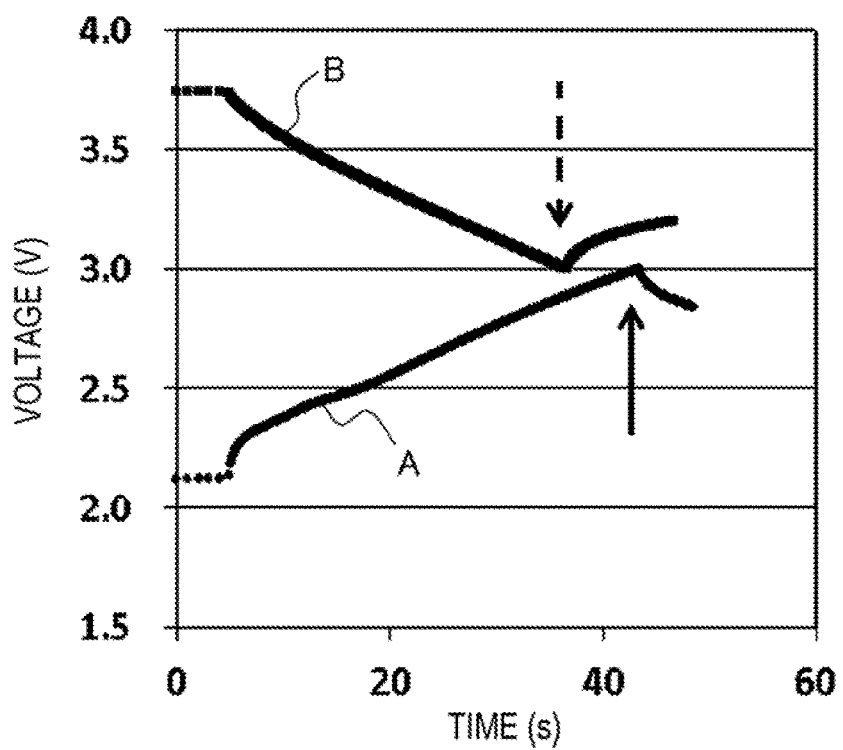
FIG. 5 is a graph depicting charge and discharge characteristics of the resistance change device of related art.
Figure 6:
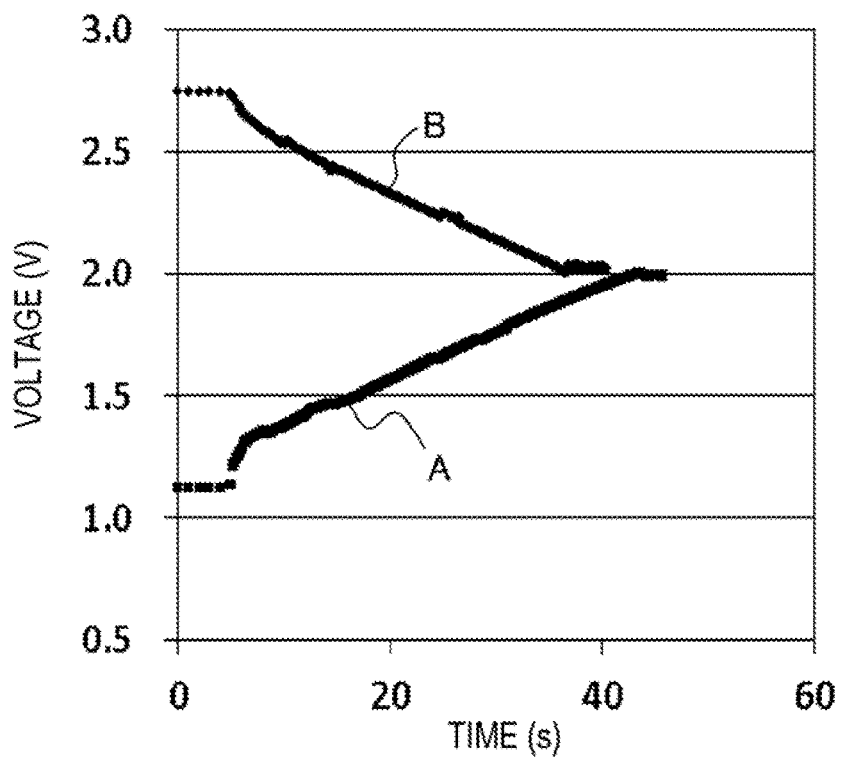
FIG. 6 is a graph depicting charge and discharge characteristics of the resistance change device according to the present embodiment.

In FIG. 5, charge and discharge characteristics of the resistance change device 11 of related art (for example, see FIG. 4) are depicted. In FIG. 6, charge and discharge characteristics of the resistance change device 9 of the present embodiment (for example, see FIG. 1) are depicted.

Note that in the resistance change device 11 of related art (for example, see FIG. 4), an operation to extract ions (elements) from the resistance change layer 2 and decrease its resistance value is referred to as "charge", and the charge characteristics are indicated by a solid line A in FIG. 5.

Conversely, an operation to make ions (elements) enter the resistance change layer 2 and increase its resistance value is referred to as "discharge" and the discharge characteristics are indicate by a solid line B in FIG. 5.

In the resistance change device 9 of the present embodiment (for example, see FIG. 1), an operation to apply a positive voltage to the side of the first resistance change layer 2 using a positive-electrode active material among the two resistance change layers 2 and 4, extract ions (elements) from the first resistance change layer 2, make the ions (elements) enter the second resistance change layer 4, and decrease the resistance value of the first resistance change layer 2 and second resistance change layer 4 is referred to as "charge", and the charge characteristics are indicated by a solid line A in FIG. 6.

Conversely, an operation to apply a positive voltage to the side of the second resistance change layer 4 using a negative-electrode active material among the two resistance change layers 2 and 4, extract ions (elements) from the second resistance change layer 4, make the ions (elements) enter the first resistance change layer 2, and increase the resistance, value of the first resistance change layer 2 and second resistance change layer 4 is referred to as "discharge", and the discharge characteristics are indicated by a solid line B in FIG. 6.

As depicted in FIG. 5, in the resistance change device 11 of related art (for example, see FIG. 4), the charge and the discharge are ended when a target voltage (3 V in FIG. 5) is generated (portions indicated by arrows in FIG. 5), but the voltage does not stay at the target voltage and a voltage return occurs.

This is called a relaxation phenomenon, and it occurs due to a situation in which the ions having been taken in and out return to the original positions after the charge and discharge having been ended. Due to this phenomenon, the amount of ions (elements) is deviated from the original target amount of ions in the resistance change layer 2 so that the resistance value is deviated.

In contrast, as depicted in FIG. 6, in the resistance change device 9 of the present embodiment (for example, see FIG. 1), the charge and the discharge are simultaneously performed in the two resistance change layers 2 and 4, that is, the operation to extract the ions and the operation to make the ions enter are carried out simultaneously in the two resistance change layers 2 and 4. This suppresses each relaxation phenomenon, and therefore an effect of reducing the deviation relative to the target voltage (2 V in FIG. 6) caused by the above-mentioned-return is obtaine.

The voltage generated in the resistance change device 11 of related art (for example, see FIG. 4) differs from the voltage generated in the resistance change device 9 of the present embodiment (for example, see FIG. 1) because their negative-electrode active materials are different from each other.

Next, a manufacturing method for the resistance change device according to the present embodiment will be described.

The manufacturing method for the resistance change device according to the present embodiment includes a process of forming the first resistance change layer 2, a process of forming the ion conductive layer 3, and a process of forming the second resistance change layer 4 (for example, see FIG. 1).

In the process of forming the first resistance change layer 2, formed is the first resistance change layer 2 which is able to occlude and discharge ions of at least one type, and the resistance of which changes in accordance with the amount of the ions in such a manner that the resistance decreases when the ions are discharged and the resistance increases when the ions are occluded.

In the process of forming the ion conductive layer 3, the ion conductive layer 3 configured to carry ions is formed on the first resistance change layer 2.

In the process of forming the second resistance change layer 4, on the ion conductive layer 3, formed is the second resistance change layer 4 which is able to occlude and discharge ions, and the resistance of which changes in accordance with the amount of the ions in such a manner that the resistance increases when the ions are discharged and the resistance decreases when the ions are occluded.

For example, in a case of using Li ions, it is possible to manufacture the resistance change device 9 in the following manner: a Pt/Ti layer (a Pt/Ti laminated film, which is a laminated film where a Pt film is laminated on a Ti film in this case) as the first electrode 5 and second electrode 6, an $LiCoO_2$ layer as the first resistance change layer 2, an $Li_3PO_4$ layer as the ion conductive layer 3, an $Li_4Ti_5O_{12}$ layer as the second resistance change layer 4, and a TiN/Pt layer (a TiN/Pt laminated film, which is a laminated film where a TiN film is laminated on a Pt film in this case) as the third electrode 7 and fourth electrode 8 are laminated on the substrate 1 by using masks (for example, see FIG. 1).

Note that the third electrode 7 and fourth electrode 8 are each formed of the TiN/Pt layer, where the TiN film is provided in the upper-side layer. This is because the above constitution is compatible with wiring provided on the electrodes 7 and 8. If the above point is not taken into consideration for example, a Ti layer or the like may be used instead.

The reason why the above-discussed configuration is employed will be described below.

A technology called artificial intelligence (AI) has attracted rising attention in recent years, and the development of the technology has been accelerated vigorously. Among the AI-related technologies, machine learning using basic learning data is in the spotlight today.

In the machine learning, weighting is performed beforehand in accordance with importance of each data element using basic data. With the weighting, it becomes possible for the machine itself to determine and predict results with respect to a large amount of new data. Accordingly, the process of weighting is considered as a significantly important process.

In order to perform weighting in a computer, there exists a method in which the weights are stored in a memory.

However, there are problems that the processing speed is lowered and that the power consumption is increased, because the weights are read out every time.

As such, a method in which a resistance value change of a resistance device is used for weights is under study. In other words, it is a method that utilizes the following phenomenon for weighting: a current flowing through the resistance device changes in accordance with a resistance value change of the resistance device.

This resistance device is required to be nonvolatile in order to store the weights.

As nonvolatile resistance memories, there exist a magnetoresistive random access memory (MRAM) making use of magnetism, a phase change random access memory (PCRAM) making use of a crystalline state, and a resistive random access memory (ReRAM) making use of oxidation-reduction or the like.

It is preferable that the weighting be represented by multiple values such as "0", "1", and "2" rather than two values such as "0" and "1" from a viewpoint of making precise predictions.

However, since the above-mentioned MRAM makes use of balance and imbalance of magnetism, it takes only two values. Since the above-mentioned ReRAM makes use of two states, that is, an oxide state and a metal state, it is difficult to maintain an intermediate state thereof. Likewise, since the above-mentioned PCRAM makes use of a crystalline state and a non-crystalline state, it is difficult to maintain an intermediate state thereof.

As such, it is considered to utilize the principle of a secondary battery such as a lithium battery whose resistance value continuously changes, that is, utilize the principle of a secondary battery configured to charge and discharge by the movement of ions between a positive-electrode active material layer and a negative-electrode active material layer through an electrolytic layer, and constitute a resistance change device by using the configuration of the stated secondary battery.

For example, as illustrated in FIG. 4, it is considered to constitute the resistance change device 11 by stacking, on a substrate 1, two electrodes 5 and 6 (read electrodes), a positive-electrode active material layer as the resistance change layer 2, a solid electrolytic layer as an ion conductive layer 3, and a negative-electrode active material layer as the ion occlusion and discharge layer 10 (also serving as an electrode).

In this case, due to the movement of ions between the positive-electrode active material layer 2 and the negative-electrode active material layer 10 through the solid electrolytic layer 3, the amount of ions in the positive-electrode active material layer 2 varies and the resistance changes in response to the variation in the amount of ions, which makes it possible to cause the above configuration to function as the resistance change device 11 by reading out the changed resistance as a resistance value between the read electrodes 5 and 6.

For example, in a case where the configuration of a lithium battery is used, an Li layer is used for the negative-electrode active material layer 10, and an $LiCoO_2$ layer is used for the positive-electrode active material layer 2, when a positive voltage is applied to two electrodes 5, 6 on the substrate 1 side and the Li layer 10 as the negative-electrode active material layer, which also serves as the electrode in the uppermost layer, is grounded, Li is extracted from the $LiCoO_2$ layer as the positive-electrode active material layer 2 and is occluded (absorbed) in the Li layer 10 through the solid electrolyte 3.

Conversely, when a positive voltage is applied to the Li layer 10 as the negative-electrode active material layer, which also serves as the electrode in the uppermost layer, and the two electrodes 5, 6 on the substrate 1 side are grounded, Li is desorbed from the Li layer 10 and is occluded (absorbed) in the $LiCoO_2$ layer as the positive-electrode active material layer 2 through the solid electrolyte 3.

In this case, a portion where the resistance is changed, that is, a portion that functions as the resistance change, layer 2 is the $LiCoO_2$ layer as the positive-electrode active material layer, and its resistance value changes in accordance with the amount of Li inside thereof.

This makes it possible to cause the above configuration to function as the resistance change device 11 in the following manner: Li in the $LiCoO_2$ layer as the positive-electrode active material layer 2 is taken in and out to vary the amount of Li and change the resistance value in response to the variation in the amount of Li, and then the resistance value of the $LiCoO_2$ layer as the positive-electrode active material layer 2 is read out as a resistance value between the read electrodes 5 and 6 disposed on both sides thereof.

The solid electrolyte is an insulation material, and does not carry electrons but allows Li ions to flow therein. An electric current flows between the read electrodes 5 and 6, not through the solid electrolytic layer 3 but through the positive-electrode active material layer 2.

However, for the positive-electrode active material layer 2, not a material having low resistivity (resistance value) such as a metal, but a substance (material) having high resistivity (resistance value) such as a transition-metal complex oxide is used.

Due to this, in a case where the above substance is used as the resistance change layer 2, the resistance becomes large and the readout current becomes small so as to cause a malfunction. Accordingly, it has been found that the configuration using such substance is insufficient to function as the resistance change device and that the desired characteristics may not be obtained.

In order to increase the readout current, although it is considered to raise a voltage to be applied, doing so is not preferable because the power consumption is increased.

Further, it is also considered to increase the size of the resistance change device 11 of related art discussed above (for example, see FIG. 4), doing so is not preferable because the device becomes large.

Although it is also considered to dispose the resistance change devices 11 of related art (for example, see FIG. 4) being aligned on a plane and connect these devices, doing so is not preferable because the configuration thereof becomes large in size.

Although it is also considered to pile up and stack the resistance change devices 11 of related art (for example, see FIG. 4) and connect these devices, doing so is not preferable because the configuration thereof becomes large in size and the process at the time of manufacturing is difficult to carry out.

Furthermore, in the resistance change device 11 of related art discussed above (for example, see FIG. 4), the negative-electrode active material layer 10 is formed of an Li layer; however, since Li is likely to react with moisture and oxygen, it is difficult to handle in a semiconductor process of manufacturing the resistance change device 11.

When moisture is present, Li easily reacts with nitrogen to generate lithium nitride ($Li_3N$). Further Li reacts with oxygen to generate lithium oxide ($Li_2O$).

In the above-described resistance change device 11 of related art (for example, see FIG. 4), although the negative-electrode active material layer 10 is formed of an Li layer, a silicon (Si) layer, a graphite (C) layer or the like may be used instead.

However, since the above-mentioned materials are also likely to react with moisture and oxygen, it is difficult to handle in a semiconductor process of manufacturing the resistance change device.

Si is not affected by water, but is oxidized by oxygen to form silicon oxide ($SiO_2$), that is, an insulator. Graphite is not affected by water, but is oxidized by oxygen to form a carbonic acid gas (CO, $CO_2$).

In order to solve the above problems, the above-described configuration (for example, see FIG. 1) is employed.

With the employment of the above configuration, the resistance change device 9 may be manufactured with ease, the expansion in size is suppressed, the increase in power consumption is suppressed, the overall resistance of the resistance change device 9 may be lowered, the readout current may be made large when the resistance value of the resistance change layers 2 and 4 is read out, the occurrence of a malfunction is suppressed, and the characteristics are improved, so that it is possible to cause the above configuration to satisfactorily function as the resistance change device 9.

Although not a complex compound but a simple elemental substance such as lithium (Li), silicon (Si), or graphite (C) has been used for a negative-electrode active material layer of a resistance change device, it is difficult to use a negative-electrode active material layer formed of these materials as a resistance change layer.

For example, even if a negative-electrode active material layer formed of Li occludes and discharges Li ions through a solid electrolytic layer, a change in resistance does not occur since the above Li ions are ions themselves. Accordingly, the negative-electrode active material layer formed of Li may not be used as a resistance change layer.

Further, a negative-electrode active material layer formed of Si, for example, is not suited to be a resistance change layer because an elemental substance of Si has significantly large resistance (for example, resistivity of $10^3$ Ωcm) in a semiconductor.

For example, a negative-electrode active material layer formed of graphite is not suited to be a resistance change layer because the resistance of graphite is too small (for example, resistivity is $10^{-3}$ Ωcm) in contrast to Si.

In addition, since the materials such as lithium (Li), silicon (Si), and graphite (C) are likely to react with moisture and oxygen, it is difficult to handle in a semiconductor process of manufacturing the resistance change device. Accordingly, it is preferable to use an oxidized material (oxide compound) resistant to moisture and oxygen for the negative-electrode active material layer.

In the case where an oxidized material is used for the negative-electrode active material layer, it is preferable that a material whose resistance changes be used, the negative-electrode active material layer also function as a resistance change layer, and the resistance change device be such a resistance change device that is provided with two resistance change layers.

This brings the following advantage in comparison with a resistance change device provided with a single resistance change layer.

That is, in the case of the resistance change device provided with a single resistance change layer, if the resistance of the resistance change layer does not change for some reason, the resistance change device becomes a defective device instantly.

On the other hand, as in the embodiment discussed above (for example, see FIG. 1), with the resistance change device 9 including the two resistance change layers 2 and 4, even if one of the resistance change layers does not change its resistance, it is highly probable that the resistance change device changes the resistance thereof as a whole as long as the other one of the resistance change layers changes its resistance; because of this, the resistance change device is still operable so that a situation in which the resistance change device instantly becomes defective may be suppressed.

Note that, in the case of a resistance change device including two resistance change layers, if the same material is used in the two resistance change layers and these two resistance change layers are made to operate in the same manner, resistance changes are canceled out in the two resistance change layers; as such, the problem that the readout current becomes small may not be solved.

For example, in a case where the same active material is used for a positive-electrode active material layer and a negative-electrode active material layer in order to make them operate at a low voltage, and these materials are made to operate in the same manner, resistance changes are canceled out in the positive-electrode active material layer and the negative-electrode active material layer; as such, the above-mentioned problem that the readout current becomes small may not be solved.

Note that a storage apparatus may be configured to include the resistance change device 9 constituted as described above.

Figure 7:
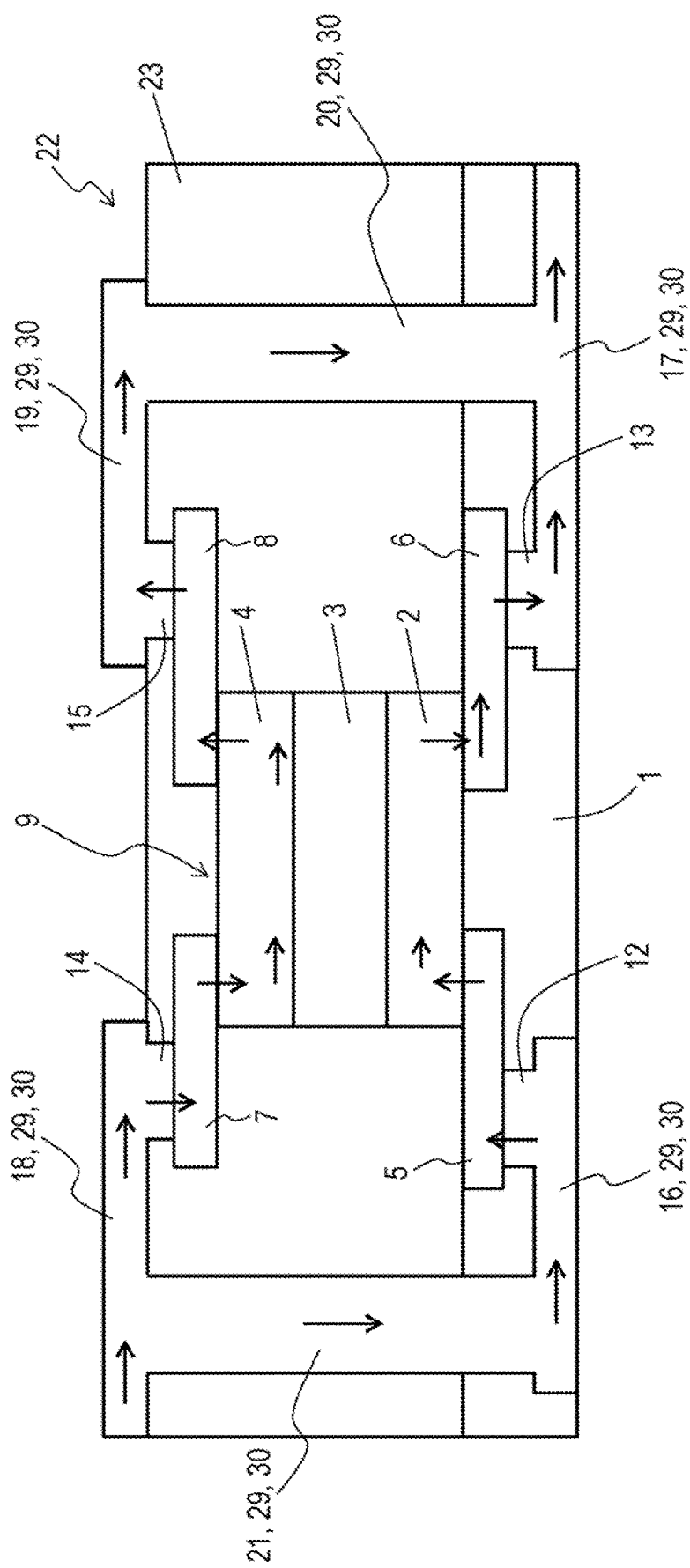
FIG. 7 is a diagram illustrating wiring to be connected in such a manner that the first resistance change layer and the second resistance change layer are connected to the resistance change device according to the present embodiment in parallel, and also illustrating a current flow at a read time.

In this case, for example, as illustrated in FIG. 7, a memory device 22 may be configured in the following manner: the resistance change devices 9 constituted as described above are disposed to be aligned in array form, and pieces of wiring 16 to 21 are connected to the first electrode 5, second electrode 6, third electrode 7, and fourth electrode 8 of each resistance change device 9 via contact portions 12 to 15 respectively so that the first resistance change layer 2 and second resistance change layer 4 are connected in parallel.

Figure 8:
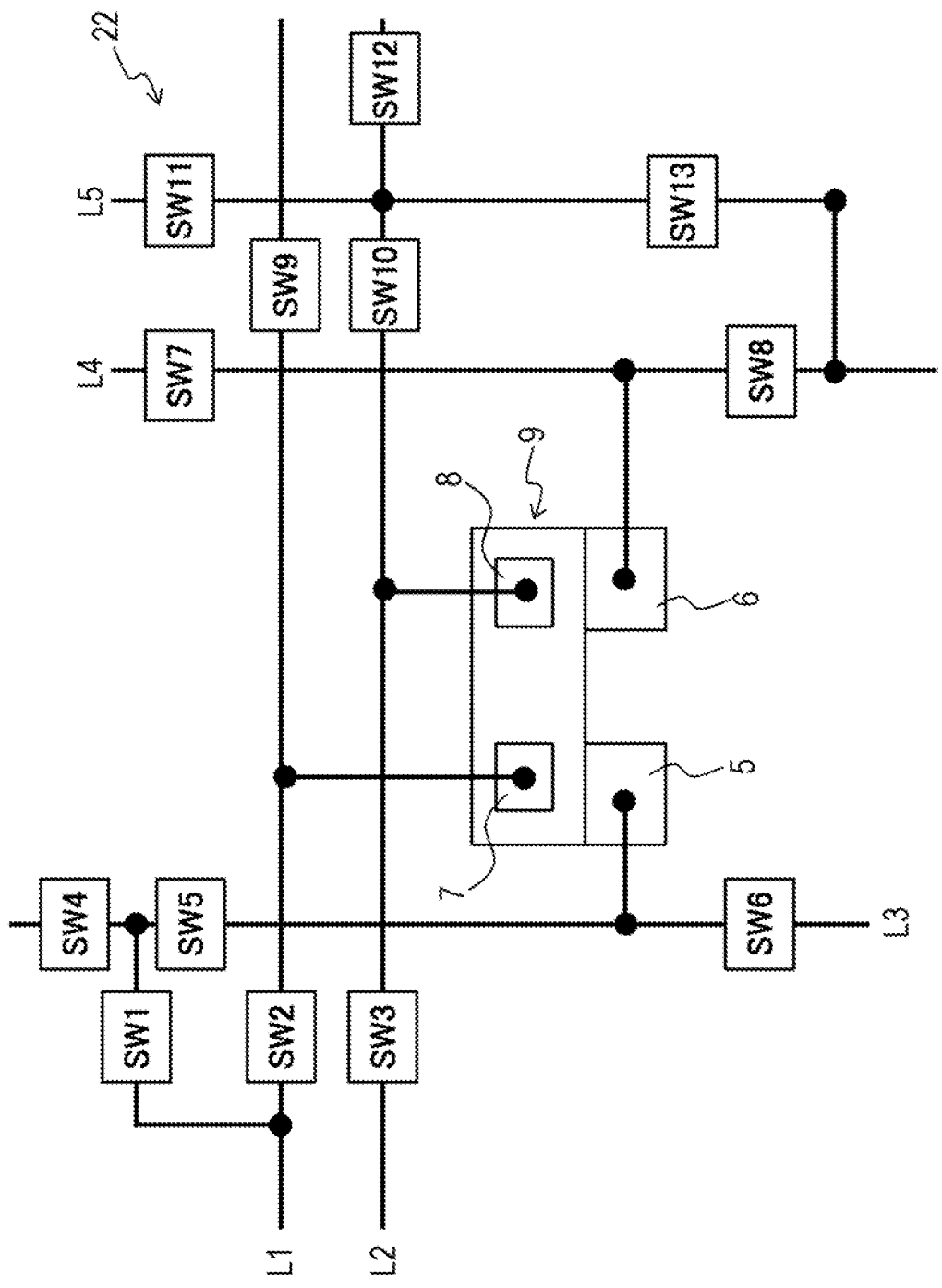
FIG. 8 is a diagram illustrating wiring and switches to be connected to a resistance change device according to the present embodiment.

In FIG. 7, a current flow at a read time is indicated by an arrow. Switches SW1 to SW13 illustrated in FIG. 8 are omitted in FIG. 7. In FIG. 7, a reference sign 23 indicates an insulation layer (interlayer film).

Further, the memory device 22 configured in this manner may be provided with, as illustrated in FIG. 8, the switches SW1 to SW13 constituted by transistors.

In FIG. 8, a black circle means a connection. Further, in FIG. 8, reference signs L1 to L5 indicate wiring, and these pieces of wiring L1 to L5 are constituted by the wiring 16 to 21 in FIG. 7.

Figure 9:
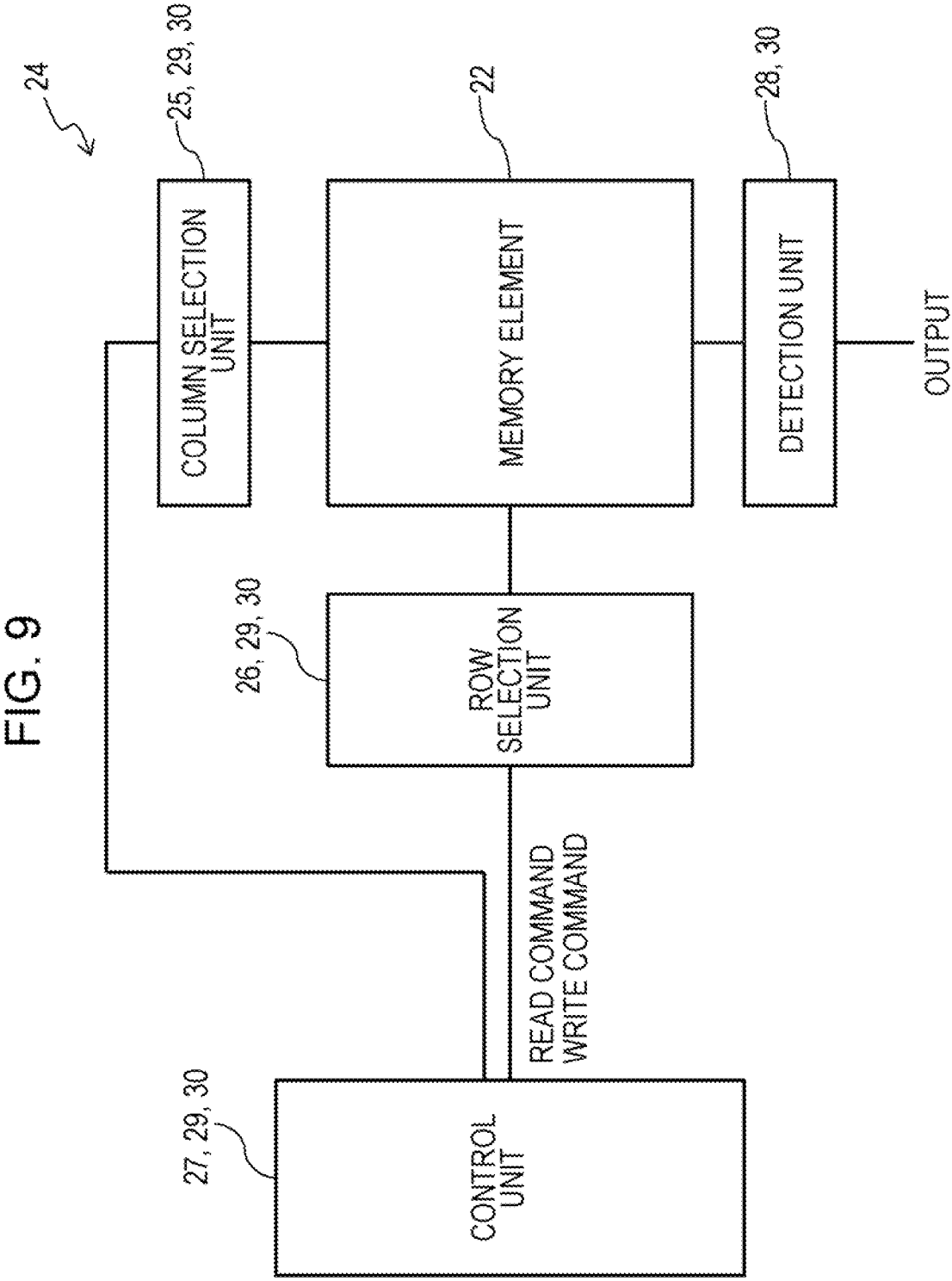
FIG. 9 is a diagram illustrating a configuration of a storage apparatus according to the present embodiment.

For example, as illustrated in FIG. 9, a storage apparatus 24 may include, for example, the memory device 22 configured as discussed above, a column selection unit 25, a line selection unit 26, a control unit 27, and a detection unit 28.

Then, any of the resistance-change devices 9 provided in the memory device 22 is selected by the column selection unit 25 and the line selection unit 26 based on a write command from the control unit 27, and information (resistance value) may be written into the selected resistance change device 9.

Here, the writing of information (resistance value) into the selected resistance change device 9 is performed as follows.

First, a case in which ions (for example, Li ions) are moved from the second resistance change layer 4 in the upper layer to the first resistance change layer 3 in the lower layer so as to write the information (resistance value) will be described.

Figure 10:
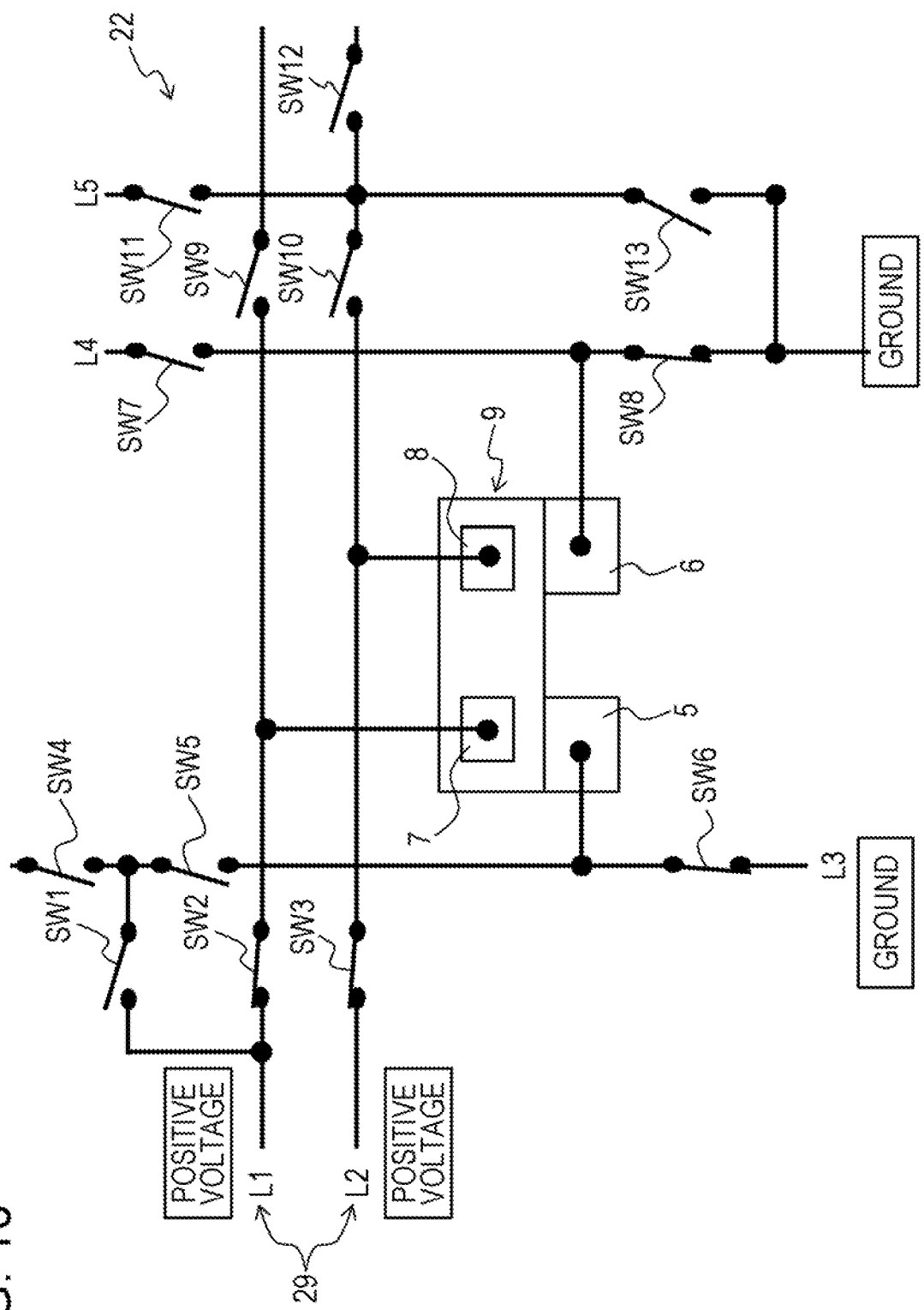
FIG. 10 is a diagram for describing an information write operation in a case where the first resistance change layer and the second resistance change layer of the resistance change device according to the present embodiment are connected in parallel.

In this case, as illustrated in FIG. 10, the switches SW2, SW3, SW6, and SW8 constituted by the transistors are switched, so that a positive voltage is applied to the third electrode 7 and fourth electrode 8 connected to the second resistance change layer 4 in the upper layer, and the first electrode 5 and second electrode 6 connected to the first resistance change layer 2 in the lower layer are grounded.

That is, the switches SW2 and SW3 constituted by the transistors are each set to an ON state to establish a conductive path, and then the positive voltage as a write voltage is applied to the wiring L1 and L2, thereby applying the positive voltage to the third electrode 7 and fourth electrode 8.

Further, the switches SW6 and SW8 are each set to an ON state to establish a conductive path, and then the wiring L3 and wiring L4 are grounded to be at a zero potential, thereby the first electrode 5 and second electrode 6 being grounded to be at a zero potential.

With this, ions (for example, Li ions) are moved from the second resistance change layer in the upper layer to the first resistance change layer 2 in the lower layer, the amount of ions in the first resistance change layer 2 and second resistance change layer 4 are controlled, and then the resistance of each of the first resistance change layer 2 and second resistance change layer 4 is changed, whereby the writing of information into the resistance change device 9 is performed.

Next, a case in which ions (for example, Li ions) are moved from the first resistance change layer 2 in the lower layer to the second resistance change layer 4 in the upper layer so as to write the information (resistance value) will be described.

Figure 11:
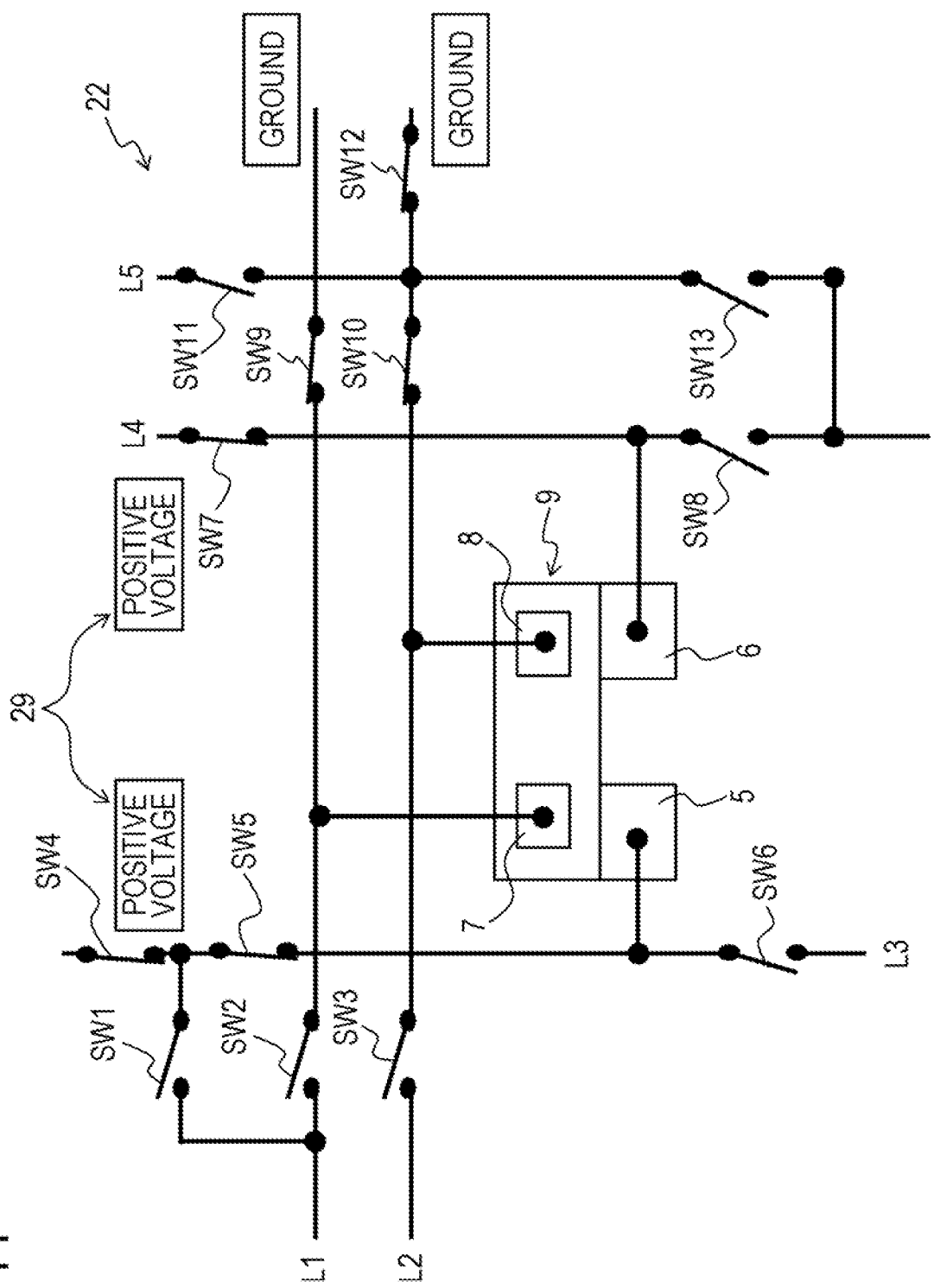
FIG. 11 is a diagram for describing an information write operation in a case where the first resistance change layer and the second resistance change layer of the resistance change device according to the present embodiment are connected in parallel.

In this case, as illustrated in FIG. 11, the switches SW4, SW5, SW7, SW9, SW10, and SW12 constituted by the transistors are switched, so that a positive voltage is applied to the first electrode 5 and second electrode 6 connected to the first resistance change layer 2 in the lower layer, and the third electrode 7 and fourth electrode 8 connected to the second resistance change layer 4 in the upper layer are grounded.

That is, the switches SW4, SW5, and SW7 constituted by the transistors are each set to an ON state to establish a conductive path, and then the positive voltage as a write voltage is applied to the wiring L3 and L4, thereby applying the positive voltage to the first electrode 5 and second electrode 6.

Further, the switches SW9, SW10, and SW12 are each set to an ON state to establish a conductive path, and then the wiring L1 and wiring L2 are grounded to be at a zero potential, thereby the third electrode 7 and fourth electrode 8 being grounded to be at a zero potential.

With this, ions (for example, Li ions) are moved from the first resistance change layer 2 in the lower layer to the second resistance change layer 4 in the upper layer, the amount of ions in the first resistance change layer 2 and second resistance change layer 4 are controlled, and then the resistance of each of the first resistance change layer 2 and second resistance change layer 4 is changed, whereby the writing of information into the resistance change device 9 is performed.

Since the information written into the resistance change device 9 in the manner discussed above, a write circuit 29 is configured to include the wiring 16 to 21, the wiring L1 to L5, the switches SW1 to SW13, the column selection unit 25, the line selection unit 26 and the control unit 27.

Further, any of the resistance change devices 9 provided in the memory device 22 is selected by the column selection unit 25 and the line selection unit 26 based on a read command from the control unit 27, and information (resistance value) may be read out from the selected resistance change device 9 by the detection unit 28.

Figure 12:
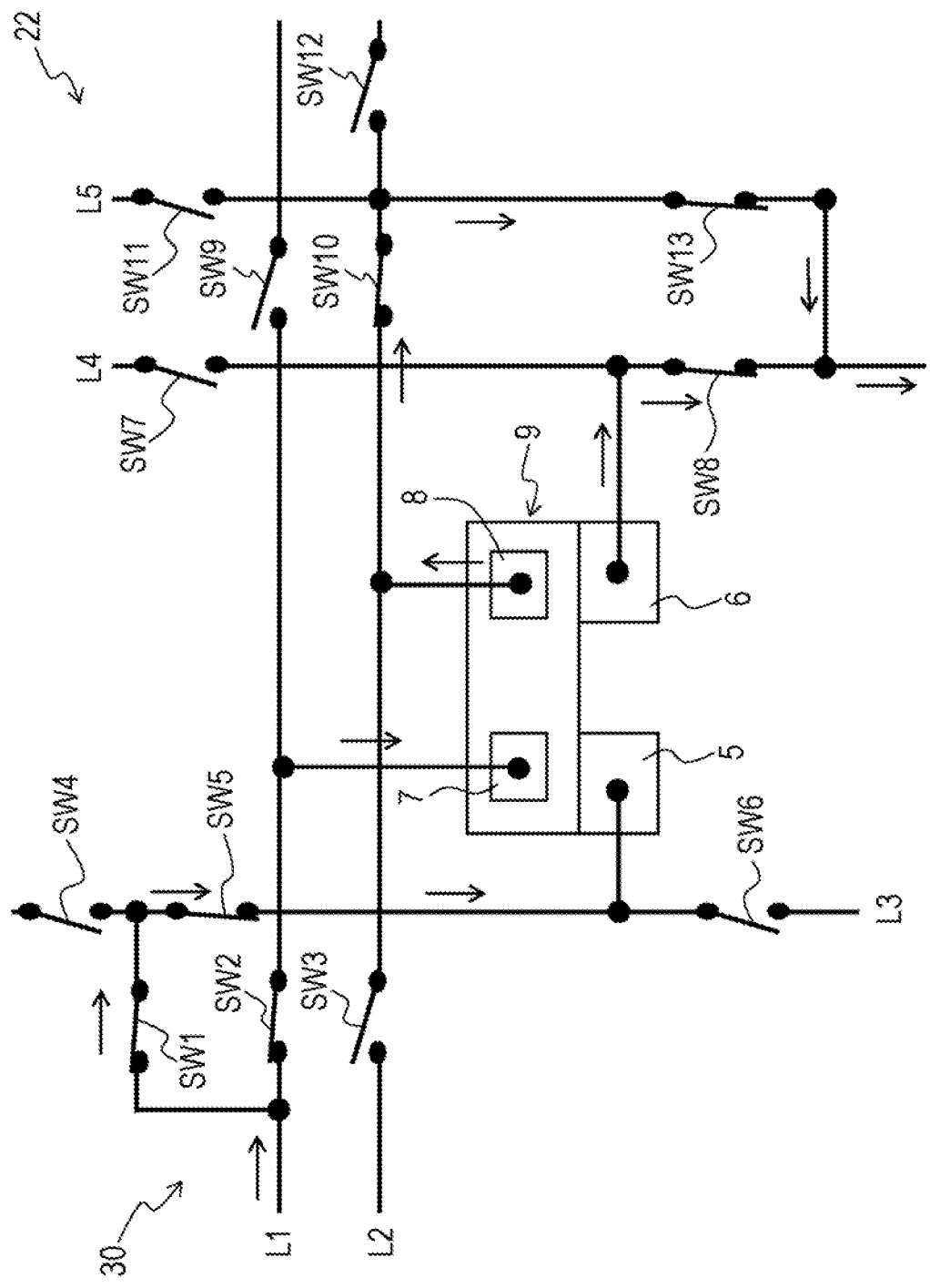
FIG. 12 is a diagram for describing an information read operation in a case where the first resistance change layer and the second resistance change layer of the resistance change device according to the present embodiment are connected in parallel.

Here, the reading of the information (resistance value) from the selected resistance change device 9 is performed by setting each of the switches SW1, SW2, SW5, SW8, SW10, and SW13 constituted by the transistors to an ON state, and then applying a read voltage to the wiring L1, as illustrated in FIG. 12.

With this, as indicated by arrows in FIG. 12, a current flows from the wiring L1, through the second resistance change layer 4 in the upper layer, toward the wiring L2, wiring L5, and wiring L4 in sequence.

Simultaneously with this, as indicated by arrows in FIG. 12, a current flows from the wiring L1 toward the wiring L3, and then flows toward the wiring L4 through the first resistance change layer in the lower layer.

Then, the currents having flowed in the resistance change layers 2 and 4 in the lower and upper layers join together in the wiring L4.

The information (resistance value) is read out by detecting the above joined current as a readout current by the detection unit 28 (for example, by the measurement with an ammeter).

Since the information is read out from the resistance change device 9 in the manner discussed above, a read circuit 30 is configured to include the wiring 16 to 21, the wiring L1 to L5, the switches SW1 to SW13, the column selection unit 25, the line selection unit 26, the control unit 27, and the detection unit 28.

In this case, the storage apparatus 24 is configured to include the resistance change device 9 configured as described above, the write circuit 29 connected to the resistance change device 9 and configured to write information into the resistance change device 9, and the read circuit 30 connected to the resistance change device 9 and configured to read out information from the resistance change device 9.

Then, the read circuit 30 configures the first resistance change layer 2 and second resistance change layer 4 to be connected in parallel, and applies a read voltage to the first resistance change layer 2 and second resistance change layer 4 to detect a current flowing through the first resistance change layer 2 and second resistance change layer 4, thereby reading out the information.

In the case where the resistance change device 9 includes the first electrode 5 and second electrode 6 that are provided separate from each other to be connected to the first resistance change layer 2, and the third electrode 7 and fourth electrode 8 that are provided separate from each other to be connected to the second resistance change layer 4, the write circuit 29 and the read circuit 30 perform writing and reading in the following manner.

That is, the write circuit 29 applies a write voltage to the first resistance change layer 2 and second resistance change layer 4 via at least one of the first electrode 5 and second electrode 6 and via at least one of the third electrode 7 and fourth electrode 8, and writes the information by changing the resistance of the first resistance change layer 2 and second resistance change layer 4.

The read circuit 30 applies a read voltage to the first resistance change layer 2 via the first electrode 5 and second electrode 6, and also applies the read voltage to the second resistance change layer 4 via the third electrode 7 and fourth electrode 8, and reads out the information by detecting a current flowing through the first resistance change layer 2 and second resistance change layer 4.

Further, the write circuit 29 applies a positive voltage to at least one of the first electrode 5 and second electrode 6 and grounds at least one of the third electrode 7 and fourth electrode 8, or grounds at least one of the first electrode 5 and second electrode 6 and applies a positive voltage to at, least one of the third electrode 7 and fourth electrode 8, whereby the write circuit 29 applies a write voltage to the first resistance change layer 2 and second resistance change layer 4.

Therefore, the resistance change device, the manufacturing method for the stated resistance change device, and the storage apparatus according to the present embodiment are able to obtain a sufficient readout current, and have an advantage of suppressing the occurrence of a malfunction.

Although, in the above-described embodiment, the information is read out by configuring the first resistance change layer 2 and second resistance change layer 4 to be connected in parallel, the configuration is not limited thereto.

Figure 13:
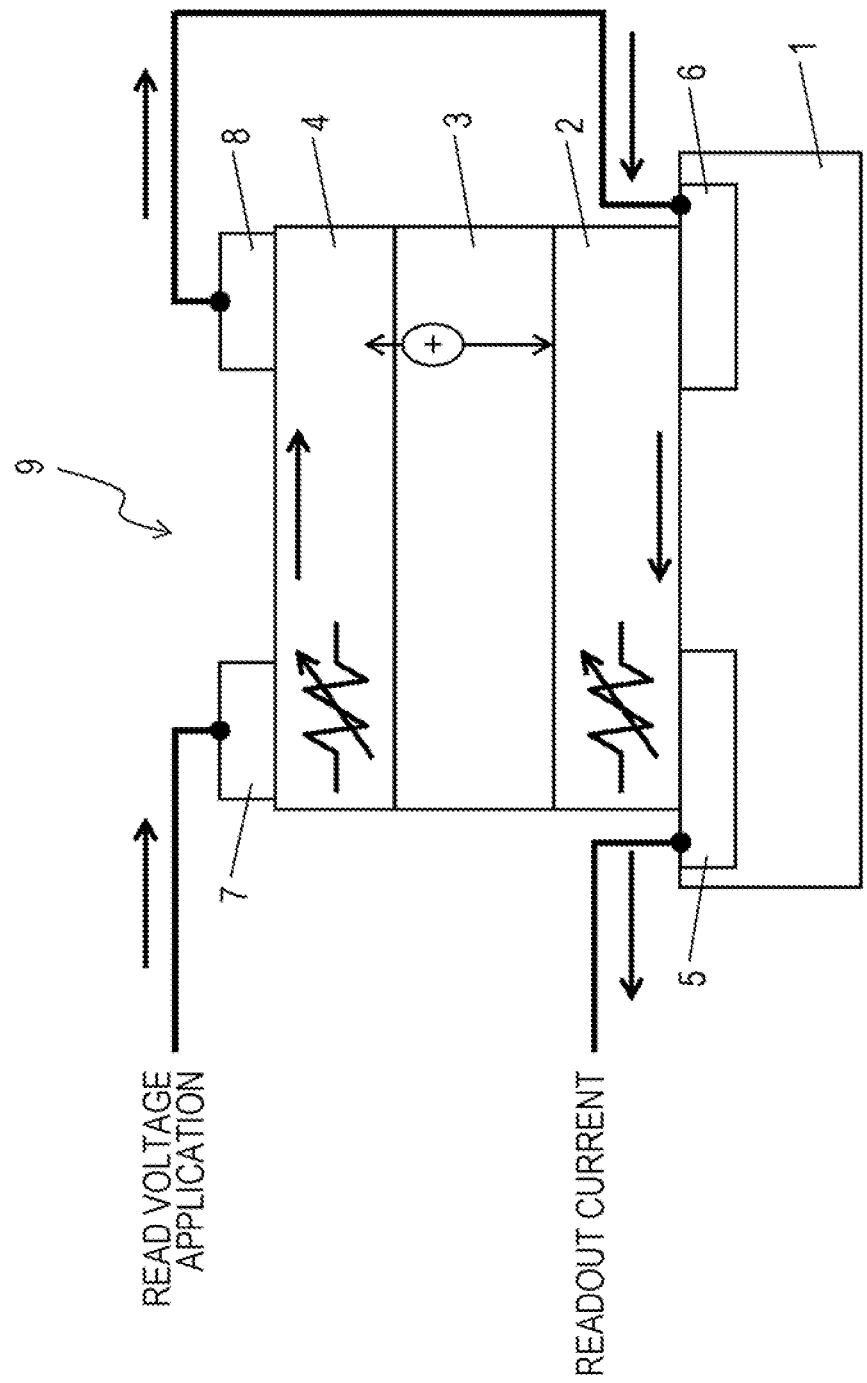
FIG. 13 is diagram illustrating a case where the first resistance change layer and the second resistance change layer of the resistance change device according to the present embodiment are connected in series.

For example, as illustrated in FIG. 13, the first resistance change layer 2 and second resistance change layer 4 may be configured to be connected in series, and a read voltage may be applied to the first resistance change layer 2 and second resistance change layer 4 to detect a current flowing through the first resistance change layer 2 and second resistance change layer 4, whereby the information may be read out.

In this case, even if one of the two resistance change layers 2 and 4 is short-circuited or is in a significantly low resistance state for some reason, the resistance change device 9 functions normally as a whole when the other one of them has no problem, thereby making it possible to suppress a situation in which the resistance change device 9 instantly becomes a defective device. The resistance change layer being short-circuited or being in a significantly low resistance state is in the same state as being merely wiring.

As discussed above, in order to suppress the situation where the resistance change device 9 instantly becomes a defective device, the first resistance change layer 2 and second resistance change layer 4 may also be used in such a manner as to be connected in series.

Figure 14:
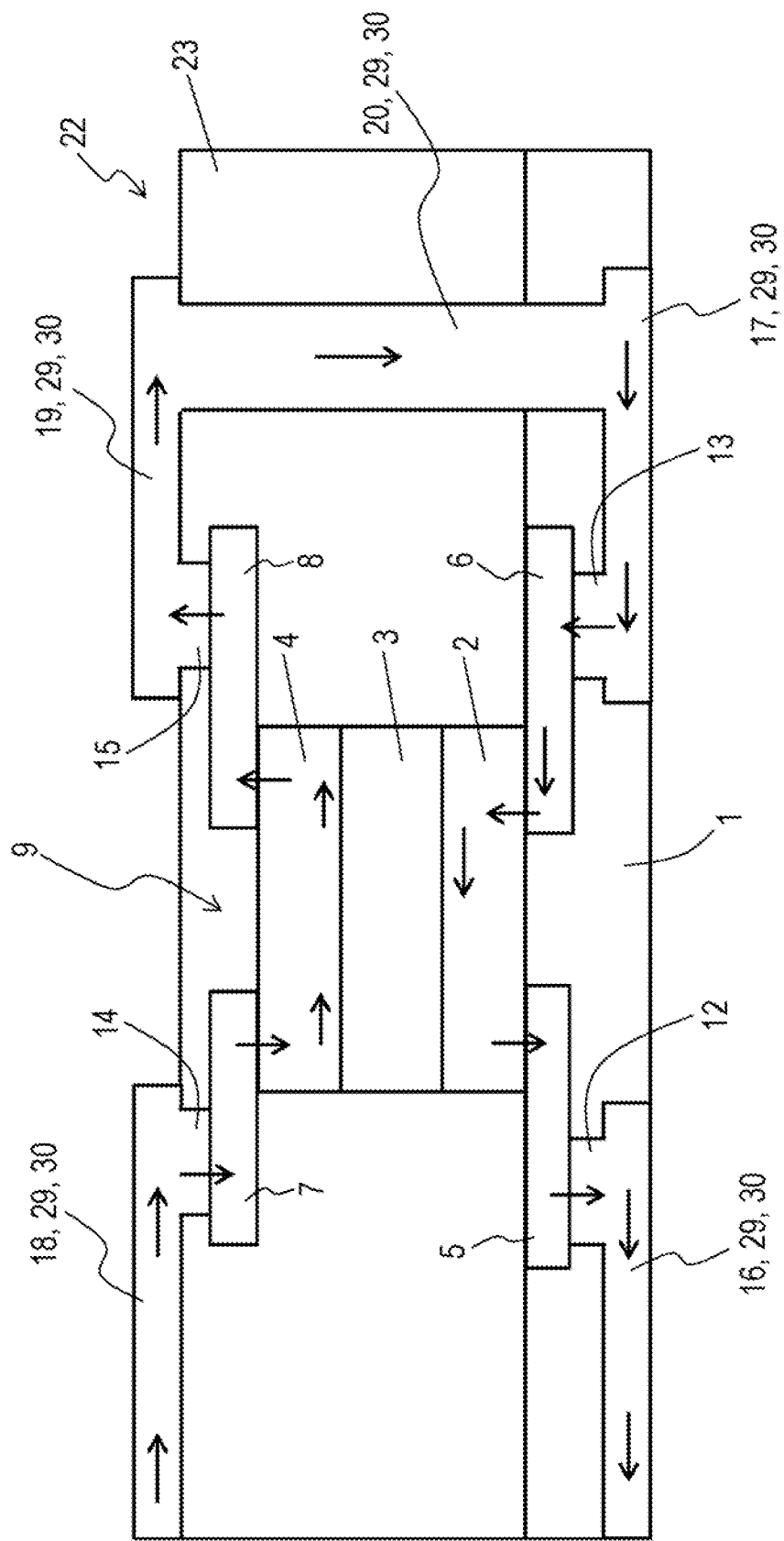
FIG. 14 is a diagram illustrating wiring to be connected in such a manner that the first resistance change layer and the second resistance change layer are connected to the resistance change device according to the present embodiment in series, and also illustrating a current flow at a read time.

In the case where, as described above, the first resistance change layer 2 and second resistance change layer 4 are connected in series, the memory device 22 may be configured by connecting the wiring 16 to 20 to the first electrode 5, second electrode 6, third electrode 7, and fourth electrode 8 of the resistance change device 9 via the contact portions 12 to 15 respectively, as illustrated in FIG. 14, for example.

Figure 15:
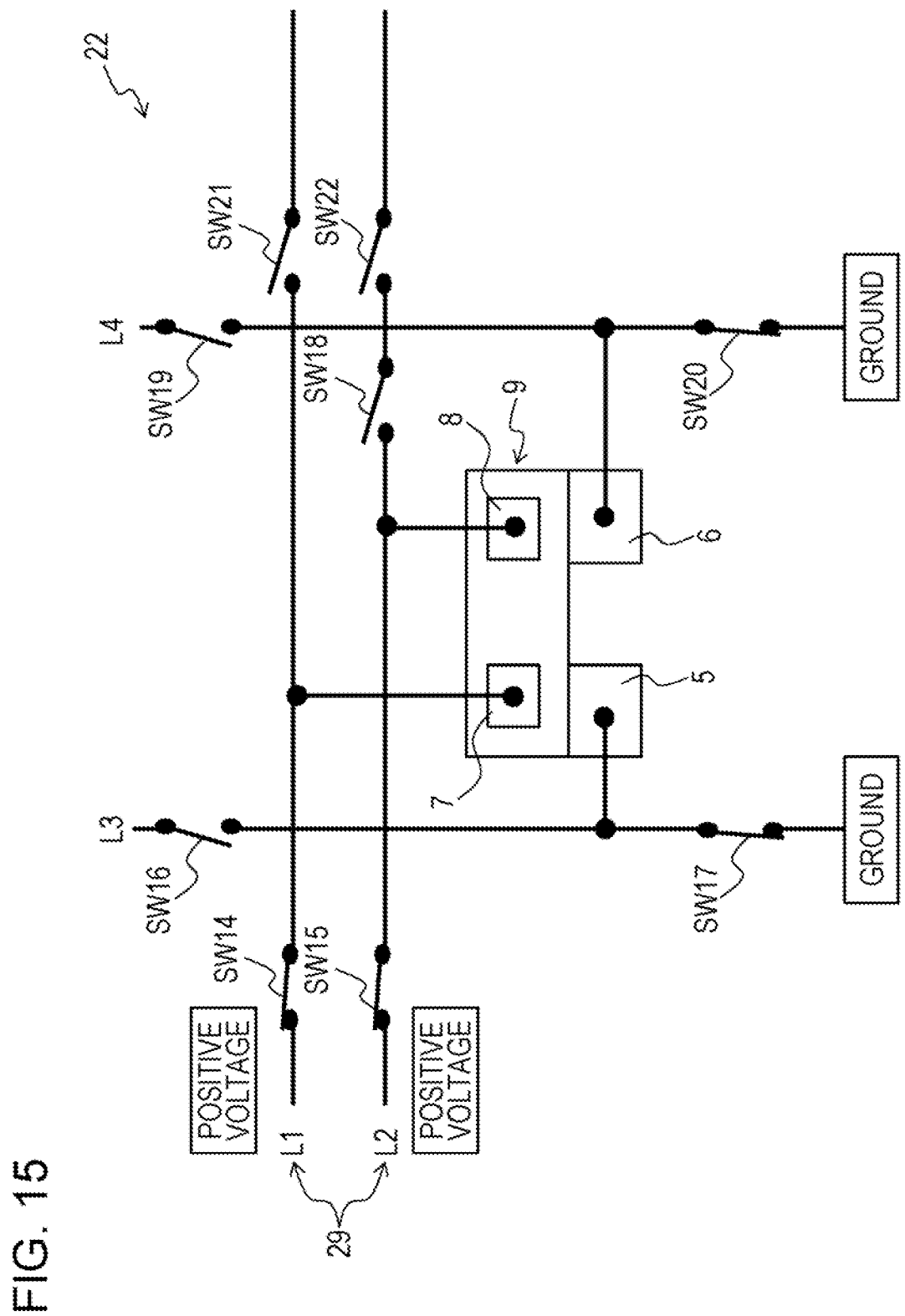
FIG. 15 is a diagram for describing an information write operation in a case where the first resistance change layer and the second resistance change layer of the resistance change device according to the present embodiment are connected in series.
Figure 16:
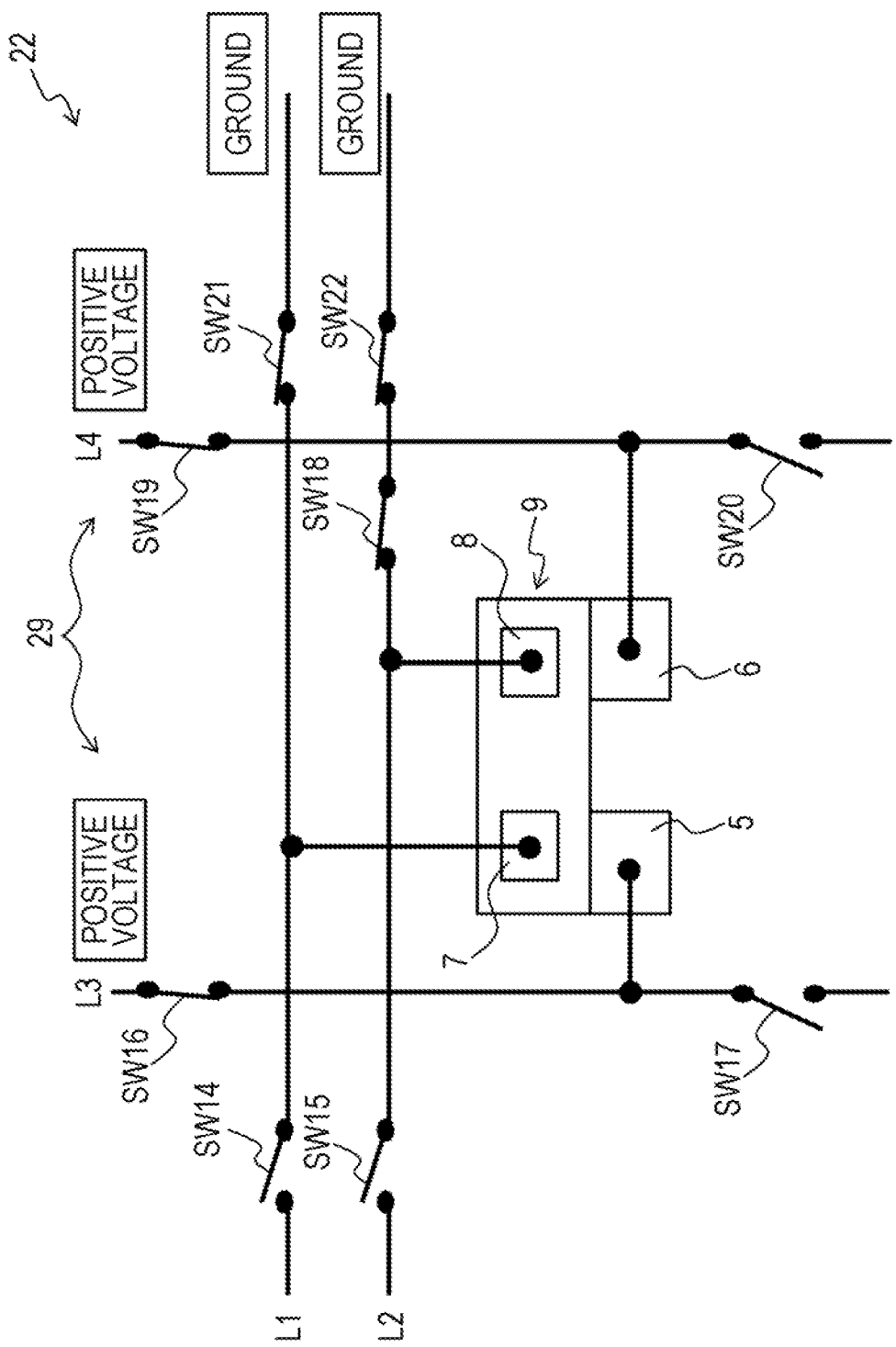
FIG. 16 is a diagram for describing an information write operation in a case where the first resistance change layer and the second resistance change layer of the resistance change device according to the present embodiment are connected in series.
Figure 17:
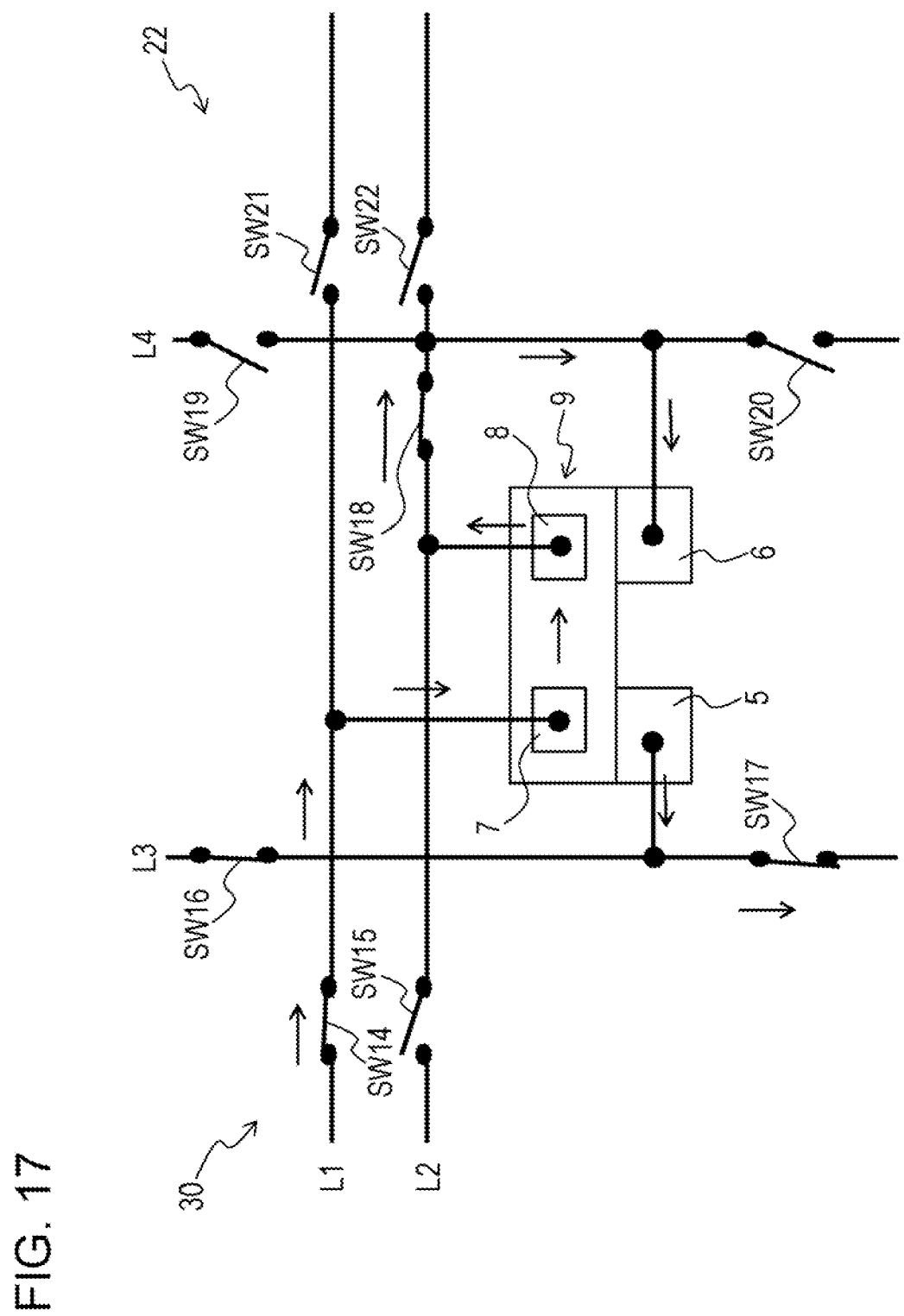
FIG. 17 is a diagram for describing an information read operation in a case where the first resistance change layer and the second resistance change layer of the resistance change device according to the present embodiment are connected in series.

In FIG. 14, a current flow at a read time is indicated by an arrow. Switches SW14 to SW22 illustrated in FIGS. 15 to 17 are omitted in FIG. 14. In FIG. 14, the reference sign 23 indicates an insulation layer (interlayer film).

The memory device 22 configured in this manner may be provided with, as illustrated in FIGS. 15 to 17, the switches SW14 to SW22 constituted by transistors.

In FIGS. 15 to 17, a black circle means a connection. Further, in FIGS. 15 to 17, the reference signs L1 to L4 indicate wiring, and these pieces of ring L1 to L4 are constituted by the wiring 16 to 20 in FIG. 14.

The storage apparatus 24 may include the memory device 22 configured as discussed above, the column selection unit 25, the line selection unit 26, the control unit 27, and the detection unit 28 (for example, see FIG. 9).

Then, any of the resistance change devices 9 provided in the memory device 22 is selected by the column selection unit 25 and the line selection unit 26 based on a write command from the control unit 27, and information (resistance value) may be written into the selected resistance change device 9.

Here, the writing of information (resistance value) into the selected resistance change device 9 is performed as follows.

First, a case in which ions (for example, Li ions) are moved from the second resistance change layer 4 in the upper layer to the first resistance change layer 2 in the lower layer so as to write the information (resistance value) will be described.

In this case, as illustrated in FIG. 15, the switches SW14, SW15, SW17, and SW20 constituted by the transistors are switched, so that a positive voltage is applied to the third electrode 7 and fourth electrode 8 connected to the second resistance change layer 4 in the upper layer, and the first electrode 5 and second electrode 6 connected to the first resistance change layer 2 in the lower layer are grounded.

That is, the switches SW14 and SW15 constituted by the transistors are each set to an ON state to establish a conductive path, and then the positive voltage as a write voltage is applied to the wiring L1 and L2 thereby applying the positive voltage to the third electrode 7 and fourth electrode 8.

Further, the switches SW17 and SW20 are each set to an ON state to establish a conductive path, and then the wiring L3 and wiring L4 are grounded to be at a zero potential, thereby the first electrode 5 and second electrode 6 being grounded to be at a zero potential.

With this, ions (for example, Li ions) are moved from the second resistance change layer 4 in the upper layer to the first resistance change layer 2 in the lower layer, the amount of ions in the first resistance change layer 2 and second resistance change layer 4 are controlled, and then the resistance of each of the first resistance change layer 2 and second resistance change layer 4 is changed, whereby the writing of information into the resistance change device 9 is performed.

Next, a case in which ions (for example, Li ions) are moved from the first resistance change layer 2 in the lower layer to the second resistance change layer 4 in the upper layer so as to write the information (resistance value) will be described.

In this case, as illustrated in FIG. 16, the switches SW16, SW18, SW19, SW21, and SW22 constituted by the transistors are switched, so that a positive voltage is applied to the first electrode 5 and second electrode 6 connected to the first resistance change layer 2 in the lower layer, and the third electrode 7 and fourth electrode 8 connected to the second resistance change layer 4 in the upper layer are grounded.

That is, the switches SW16 and SW19 constituted by the transistors are each set to an ON state to establish a conductive path, and then the positive voltage as a write voltage is applied to the wiring L3 and L4, thereby applying the positive voltage to the first electrode 5 and second electrode 6.

Further, the switches SW18, SW21, and SW22 are each set to an ON state to establish a conductive path, and then the wiring L1 and wiring L2 are grounded to be at a zero potential, thereby the third electrode 7 and fourth electrode 8 being grounded to be at a zero potential.

With this, ions (for example, Li ions) are moved from the first resistance change layer 2 in the lower layer to the second resistance change layer 4 in the upper layer, the amount of ions in the first resistance change layer 2 and second resistance change layer 4 are controlled, and then the resistance of each of the first resistance change layer 2 and second resistance change layer 4 is changed, whereby the writing of information into the resistance change device 9 is performed.

Since the information is written into the resistance change device 9 in the manner discussed above, the write circuit 29 is configured to include the wiring 16 to 20, the wiring L1 to L4, the column selection unit 25, the line selection unit 26, and the control unit 27.

Further, any of the resistance change devices 9 provided in the memory device 22 is selected by the column selection, unit 25 and the line selection unit 26 based on a read command from the control unit 27, and information (resistance value) may be read out from the selected resistance change device 9 by the detection unit 28.

Here, the reading of the information (resistance value) from the selected resistance change device 9 is performed by setting each of the switches SW14, SW16, SW17, and SW18 constituted by the transistors to an ON state, and then applying a read voltage to the wiring L1, as illustrated in FIG. 17.

With this, as indicated by arrows in FIG. 17, a current flows from the wiring L1, through the second resistance change layer 4 in the upper layer, toward the wiring L2 and wiring L4 in sequence, and further flows toward the wiring L3 through the first resistance change layer 2 in the lower layer.

The current having flowed through the resistance change layers 2 and 4 in the lower and upper layers flows in the wiring L3.

The information (resistance value) is read out by detecting this current as a readout current by the detection unit 28 (for example, by the measurement with an ammeter).

Since the information is read out from the resistance change device 9 in the manner discussed above, the read circuit 30 is configured to include the wiring 16 to 20, the wiring L1 to L4, the column, selection unit 25, the line selection unit 26, the control unit 27, and the detection unit 28.

In this case, the storage apparatus 24 is configured to include the resistance change device 9 configured as described above, the write circuit 29 connected to the resistance change device 9 and configured to write information into the resistance change device 9, and the read circuit 30 connected to the resistance change device 9 and configured to read out information from the resistance change device 9.

Then, the read circuit 30 configures the first resistance change layer 2 and second resistance change layer 4 to be connected in series, and applies a read voltage to the first resistance change layer 2 and second resistance change layer 4 to detect a current flowing through the first resistance change layer 2 and second resistance change layer 4, thereby reading out the information.

In the case where the resistance change device 9 includes the first electrode 5 and second electrode 6 that are provided separate from each other to be connected to the first resistance change layer 2, and the third electrode 7 and fourth electrode 8 that are provided separate from each other to be connected to the second resistance change layer 4, the write circuit 29 and the read circuit 30 perform writing and reading in the following manner.

That is, the write circuit 29 applies a write voltage to the first resistance change layer 2 and second resistance change layer 4 via at least one of the first electrode 5 and second electrode 6 and via at least one of the third electrode 7 and fourth electrode 8, and writes the information by changing the resistance of the first resistance change layer 2 and second resistance change layer 4.

The read circuit 30 applies a read voltage to the first resistance change layer 2 via the first electrode 5 and second electrode 6, and also applies the read voltage to the second resistance change layer 4 via the third electrode 7 and fourth electrode 8, and reads out the information by detecting a current flowing through the first resistance change layer 2 and second resistance change layer 4.

Further, the write circuit 29 applies a positive voltage to at least one of the first electrode 5 and second electrode 6 and grounds at least one of the third electrode 7 and fourth electrode 8, or grounds at least one of the first electrode 5 and second electrode 6 and applies a positive voltage to at least one of the third electrode 7 and fourth electrode 8, whereby the write circuit 29 applies a write voltage to the first resistance change layer 2 and second resistance change layer 4.

Note that the present disclosure is not limited to the configurations described in the above embodiments, and may be variously modified without departing from the spirit and scope of the present disclosure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A resistance change device comprising:
   a first resistance change layer that occludes and discharges ions of at least one type, and resistance of the first resistance change layer changes in accordance with an amount of the ions in such a manner that the resistance decreases when the ions are discharged and the resistance increases when the ions are occluded;
   a second resistance change layer that occludes and discharges the ions, and resistance of the second resistance change layer changes in accordance with the amount of the ions in such a manner that the resistance increases when the ions are discharged and the resistance decreases when the ions are occluded;
   an ion conductive layer that carries the ions and is provided between the first resistance change layer and the second resistance change layer;
   a first electrode and a second electrode that are disposed separate from each other and connected to the first resistance change layer; and
   a third electrode and a fourth electrode that are disposed separate from each other and connected to the second resistance change layer, wherein
   a write circuit writes information by applying a write voltage to the first resistance change layer and the second resistance change layer via at least one of the first electrode and the second electrode and via at least one of the third electrode and the fourth electrode to cause the resistance of the first resistance change layer and the second resistance change layer to change, and
   a read circuit reads information by applying a read voltage to the first resistance change layer via the first electrode and the second electrode, also applying the read voltage to the second resistance change layer via the third electrode and the fourth electrode, and detecting a current flowing through the first resistance change layer and the second resistance change layer.

2. The resistance change device according to claim 1, wherein the ions discharged from the first resistance change layer pass through the ion conductive layer to be occluded in the second resistance change layer, and the ions discharged from the second resistance change layer pass through the ion conductive layer to be occluded in the first resistance change layer.

3. The resistance change device according to claim 1, wherein the ions discharged from the first resistance change layer pass through the ion conductive layer to be occluded in the second resistance change layer, so that both the resistance of the first resistance change layer and the resistance of the second resistance change layer decrease, and the ions discharged from the second resistance change layer pass through the ion conductive layer to be occluded in the first resistance change layer, so that both the resistance of the first resistance change layer and the resistance of the second resistance change layer increase.

4. The resistance change device according to claim 1, wherein resistance changes occur simultaneously in the first resistance change layer and the second resistance change layer at a write time.

5. The resistance change device according to claim 1, wherein the first resistance change layer is a positive-electrode active material layer formed of a positive-electrode active material used in an ion battery, the ion conductive layer is a solid electrolytic layer formed of a solid electrolyte used in the ion battery, and the second resistance change layer is a negative-electrode active material layer formed of a negative-electrode active material used in the ion battery.

6. The resistance change device according to claim 5, wherein
the positive-electrode active material is one of $LiCoO_2$, $LiNiO_2$, $LiTi_5O_{12}$, $LiMnO_2$, $LiFePO_4$;
the ion conductive layer is one of $Li_3PO_4$, $Li_9Al_3(P_2O_7)_3(PO_4)_2$, $Li_{2.9}PO_{3.3}N_{0.46}$, $(La, Li)TiO_3$; and
the negative-electrode active material is $Li_4Ti_5O_{12}$.

7. A storage apparatus comprising:

a resistance change device;

a write circuit connected to the resistance change device and configured to write information into the resistance change device; and a read circuit connected to the resistance change device and configured to read out information from the resistance change device, wherein the resistance change device includes a first resistance change layer that occludes and discharges ions of at least one type, and resistance of the first resistance change layer changes in accordance with an amount of the ions in such a manner that the resistance decreases when the ions are discharged and the resistance increases when the ions are occluded, a second resistance change layer that occludes and discharges the ions, and resistance of the second resistance change layer changes in accordance with the amount of the ions in such a manner that the resistance increases when the ions are discharged and the resistance decreases when the ions are occluded, and an ion conductive layer that carries the ions and is provided between the first resistance change layer and the second resistance change layer, wherein the resistance change device includes a first electrode and a second electrode that are disposed separate from each other and connected to the first resistance change layer, and a third electrode and a fourth electrode that are disposed separate from each other and connected to the second resistance change layer, the write circuit writes information by applying a write voltage to the first resistance change layer and the second resistance change layer via at least one of the first electrode and the second electrode and via at least one of the third electrode and the fourth electrode to cause the resistance of the first resistance change layer and the second resistance change layer to change, and the read circuit reads information by applying a read voltage to the first resistance change layer via the first electrode and the second electrode, also applying the read voltage to the second resistance change layer via the third electrode and the fourth electrode, and detecting a current flowing through the first resistance change layer and the second resistance change layer.

8. The storage apparatus according to claim 7, wherein the read circuit configures the first resistance change layer and the second resistance change layer to be connected in parallel, and is configured to read out information by applying a read voltage to the first resistance change layer and the second resistance change layer and detecting a current flowing through the first resistance change layer and the second resistance change layer.

9. The storage apparatus according to claim 7, wherein the read circuit configures the first resistance change layer and the second resistance change layer to be connected in series, and is configured to read out information by applying a read voltage to the first resistance change layer and the second resistance change layer and detecting a current flowing through the first resistance change layer and the second resistance change layer.

10. The storage apparatus according to claim 7, wherein the write circuit applies a positive voltage as a write voltage to at least one of the first electrode and the second electrode and grounds at least one of the third electrode and the fourth electrode to cause a change in resistance of the first resistance change layer and the second resistance change layer.

11. The storage apparatus according to claim 7, wherein the write circuit grounds at least one of the first electrode and the second electrode and applies a positive voltage to at least one of the third electrode and the fourth electrode to cause a change in resistance of the first resistance change layer and the second resistance change layer.

12. The storage apparatus according to claim 7, wherein the ions discharged from the first resistance change layer pass through the ion conductive layer to be occluded in the second resistance change layer, and the ions discharged from the second resistance change layer pass through the ion conductive layer to be occluded in the first resistance change layer.

13. The storage apparatus according to claim 7, wherein the ions discharged from the first resistance change layer pass through the ion conductive layer to be occluded in the second resistance change layer, so that both the resistance of the first resistance change layer and the resistance of the second resistance change layer decrease, and the ions discharged from the second resistance change layer pass through the ion conductive layer to be occluded in the first resistance change layer, so that both the resistance of the first resistance change layer and the resistance of the second resistance change layer increase.

14. The storage apparatus according to claim 7, wherein resistance changes occur simultaneously in the first resistance change layer and the second resistance change layer at a write time.

15. The storage apparatus according to claim 7, wherein the first resistance change layer is a positive-electrode active material layer formed of a positive-electrode active material used in an ion battery, the ion conductive layer is a solid electrolytic layer formed of a solid electrolyte used in the ion battery, and the second resistance change layer is a negative-electrode active material layer formed of a negative-electrode active material used in the ion battery.

16. A manufacturing method for a resistance change device, the method comprising:

forming a first resistance change layer to occlude and discharge ions of at least one type, and resistance of the first resistance change layer changes in accordance with an amount of the ions in such a manner that the resistance decreases when the ions are discharged and the resistance increases when the ions are occluded;

forming, on the first resistance change layer, an ion conductive layer configured to carry the ions;

forming, on the ion conductive layer, a second resistance change layer to occlude and discharge ions, and resistance of the second resistance change layer changes in accordance with the amount of the ions in such a manner that the resistance increases when the ions are discharged and the resistance decreases when the ions are occluded; and disposing a first electrode and a second electrode separate from each other and connected to the first resistance change layer;

disposing a third electrode and a fourth electrode separate from each other and connected to the second resistance change layer, wherein information is written to the resistance change device by applying a write voltage to the first resistance change layer and the second resistance change layer via at least one of the first electrode and the second electrode and via at least one of the third electrode and the fourth electrode to cause the resistance of the first resistance change layer and the second resistance change layer to change, and information is read from the resistance change device by applying a read voltage to the first resistance change layer via the first electrode and the second electrode, also applying the read voltage to the second resistance change layer via the third electrode and the fourth electrode, and detecting a current flowing through the first resistance change layer and the second resistance change layer.

* * * * *